United States Patent
Wada et al.

(10) Patent No.: US 9,563,530 B2
(45) Date of Patent: Feb. 7, 2017

(54) DEVICE STATE ESTIMATION APPARATUS, DEVICE POWER CONSUMPTION ESTIMATION APPARATUS, AND PROGRAM

(71) Applicant: Kabushiki Kaisha Toshiba, Minato-ku (JP)

(72) Inventors: Takahisa Wada, Yokohama (JP); Kazuto Kubota, Kawasaki (JP); Kyosuke Katayama, Asaka (JP); Toshiaki Edahiro, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 64 days.

(21) Appl. No.: 14/415,439

(22) PCT Filed: Jul. 2, 2014

(86) PCT No.: PCT/JP2014/067630
§ 371 (c)(1),
(2) Date: Jan. 16, 2015

(87) PCT Pub. No.: WO2015/083393
PCT Pub. Date: Jun. 11, 2015

(65) Prior Publication Data
US 2015/0317229 A1    Nov. 5, 2015

(30) Foreign Application Priority Data
Dec. 3, 2013   (JP) .................. 2013-250436

(51) Int. Cl.
*G06F 1/00*   (2006.01)
*G06F 11/30*  (2006.01)
(Continued)

(52) U.S. Cl.
CPC ......... *G06F 11/3062* (2013.01); *G01R 21/133* (2013.01); *G05B 15/02* (2013.01);
(Continued)

(58) Field of Classification Search
CPC ....................................................... G06F 1/30
(Continued)

(56) References Cited

U.S. PATENT DOCUMENTS 9,064,397 B2 * 6/2015 Kawano ............... G08G 1/16
9,267,729 B2 * 2/2016 Kang .................... F25D 23/12
(Continued)

FOREIGN PATENT DOCUMENTS

JP   2000 292465   10/2000
JP   2002 152971    5/2002
(Continued)

OTHER PUBLICATIONS

International Search Report Issued Sep. 9, 2014 in PCT/JP14/067630 Filed Jul. 2, 2014.
(Continued)

*Primary Examiner* — Suresh Suryawanshi
(74) *Attorney, Agent, or Firm* — Oblon, McClelland, Maier & Neustadt, L.L.P.

(57) ABSTRACT

According to one embodiment, a device state estimation apparatus includes a detector and an operating state estimator. The detector detects devices in the ON operating state, based on a comparison between a calculated one of a first characteristic of a current or power harmonic in a power feed line and a reference one of the first characteristic which has been predetermined for at least one device. The operating state estimator extracts at least one set of the second characteristics from plural sets of second characteristics associated with harmonic, which have been predetermined. Each set of the second characteristics is for operating states of each of the devices. The one set of the second characteristics is for operating states of the device in the ON operating state which is detected by the detector. The operating state estimator estimates the operating state of the device based
(Continued)

on the similarity between the extracted one of the second characteristics and a calculated one of the second characteristics obtained from the current or power harmonic.

16 Claims, 23 Drawing Sheets

(51) Int. Cl.
 *G06F 1/26* (2006.01)
 *G01R 21/133* (2006.01)
 *H02J 3/00* (2006.01)
 *H02J 13/00* (2006.01)
 *G05B 15/02* (2006.01)

(52) U.S. Cl.
 CPC ............ *G06F 1/26* (2013.01); *G06F 11/3055* (2013.01); *H02J 3/00* (2013.01); *H02J 13/00* (2013.01); *Y02B 60/165* (2013.01); *Y02B 70/3266* (2013.01); *Y04S 20/242* (2013.01)

(58) Field of Classification Search
 USPC ........................................................ 713/340
 See application file for complete search history.

(56) References Cited

U.S. PATENT DOCUMENTS

| | | | |
|---|---|---|---|
| 2003/0093390 A1 | 5/2003 | Onoda et al. | |
| 2013/0332112 A1* | 12/2013 | Nakamura | G01S 17/936 702/181 |
| 2015/0112891 A1* | 4/2015 | Watanabe | G06N 99/005 706/1 |
| 2015/0286820 A1* | 10/2015 | Sridhara | G06F 21/566 726/23 |
| 2015/0309089 A1* | 10/2015 | Katsukura | G01R 21/00 324/511 |
| 2015/0309092 A1* | 10/2015 | Yu | H02J 3/24 702/66 |

FOREIGN PATENT DOCUMENTS

| | | | |
|---|---|---|---|
| JP | 2003 9430 | 1/2003 | |
| JP | WO 2006126535 A1 * | 11/2006 | ............ G01B 21/00 |
| JP | 2010210575 A * | 9/2010 | |
| JP | 2012 189526 | 10/2012 | |
| JP | 2014-75923 A | 4/2014 | |
| JP | EP 2905870 A1 * | 8/2015 | ......... H04L 12/6418 |
| JP | 2015-227811 A | 12/2015 | |
| JP | 2016-17917 A | 2/2016 | |
| WO | 01 77696 | 10/2001 | |
| WO | 2013 157294 | 10/2013 | |

OTHER PUBLICATIONS

Office Action issued Sep. 20, 2016, in Japanese Patent Application No. 2015-551401.
Masamune Nakakita et al., "Non-Intrusive Monitoring Based on Harmonics Characteristic of Appliances", Proceedings of the 25$^{th}$ Annual Conference of the Japanese Society for Artificial Intelligence, 2H2-5, 2011 [CD-ROM], Japanese Society for Artificial Intelligence, Jun. 1, 2011.

* cited by examiner

| CHANGE TIME DATA |
|---|
| TIME A |
| TIME B |
| ... |

|  | HOME APPLIANCE 1 | HOME APPLIANCE 2 |
|---|---|---|
| TIME 0 | OFF | OFF |
| ... | ... | ... |
| TIME A | ON | OFF |
| ... | ... | ... |
| TIME B | ON | ON |
| ... | ... | ... |

FIG. 7D

|  | HOME APPLIANCE 1 | HOME APPLIANCE 2 |
|---|---|---|
| TIME 0 | 0W | 0W |
| ... | ... | ... |
| TIME A | 180W | 0W |
| ... | ... | ... |
| TIME B | 180W | 50W |
| ... | ... | ... |

CHARACTERISTIC OF
OPERATING STATE A

CALCULATED CHARACTERISTIC

CHARACTERISTIC OF
OPERATING STATE A

CALCULATED CHARACTERISTIC

|  | HOME APPLIANCE 1 | HOME APPLIANCE 2 |
|---|---|---|
| TIME 0 | OFF | OFF |
| ... | ... | ... |
| TIME A | ON | OFF |
| ... | ... | ... |
| TIME B | ON | ON |
| ... | ... | ... |

|  | HOME APPLIANCE 1 | HOME APPLIANCE 2 |
|---|---|---|
| TIME 0 | 0W | 0W |
| ... | ... | ... |
| TIME A | 180W | 0W |
| ... | ... | ... |
| TIME B | 180W | 50W |
| ... | ... | ... |

DEVICE STATE ESTIMATION APPARATUS, DEVICE POWER CONSUMPTION ESTIMATION APPARATUS, AND PROGRAM

TECHNICAL FIELD

Embodiments described herein relate to a device state estimation apparatus, a device power consumption estimation apparatus, and a program.

BACKGROUND ART

Art that separately measures the operating state of electrical devices, including inverters, used in the home and the like, that, rather than installing measuring instruments in each electrical device, non-invasively estimates the operating state of each electrical device, based on a measurement on the lead-in power line from a utility pole to the home has been proposed.

When estimating the operating state of each electrical device, if a plurality of home appliances is simultaneously operating, the number of combinations in the estimation becomes extremely large, and the amount of operation time and amount of memory capacity used in the operation processing might increase. Additionally, because the number of combinations in the operation processing becomes extremely large, erroneous detection might more frequently occur.

PRIOR ART REFERENCES

Patent References

Patent Reference 1 Japanese Laid-open Patent Publication No. 2000-292465
Patent Reference 2 Japanese Laid-open Patent Publication No. 2002-152971
Patent Reference 3 Japanese Laid-open Patent Publication No. 2012-189526

SUMMARY OF THE INVENTION

Problem to be Solved by the Invention

The problem that the present invention sets out to solve is that of providing a device state estimation apparatus, a device power consumption estimation apparatus, and a program capable of suppressing an increase in the operation time and memory capacity required for operation processing.

Means for Solving the Problem

According to one embodiment, a device state estimation apparatus includes a detector and an operating state estimator. The detector detects devices in the ON operating state, based on a comparison between a calculated one of a first characteristic of a current or power harmonic in a power feed line and a reference one of the first characteristic which has been predetermined for at least one device. The operating state estimator extracts at least one set of the second characteristics from plural sets of second characteristics associated with harmonic, which have been predetermined. Each set of the second characteristics is for operating states of each of the devices. The one set of the second characteristics is for operating states of the device in the ON operating state which is detected by the detector. The operating state estimator estimates the operating state of the device based on the similarity between the extracted one of the second characteristics and a calculated one of the second characteristics obtained from the current or power harmonic.

BRIEF DESCRIPTION OF THE DRAWINGS

FIG. 7D shows an example of time-sequence estimation results of the power consumption in the flowchart of FIG. 6.

DESCRIPTION OF EMBODIMENTS

Figure 1:
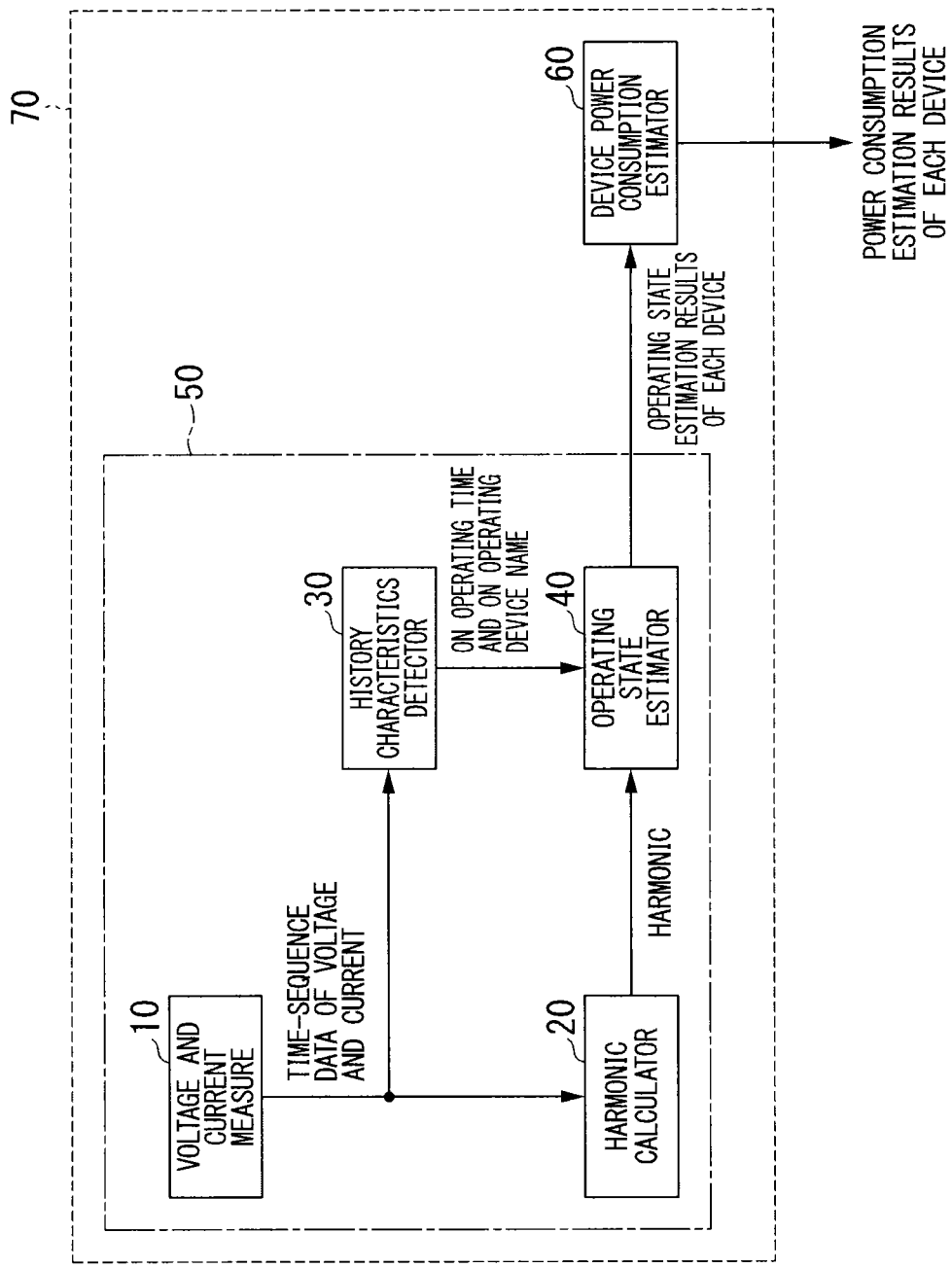
FIG. 1 shows the constitution of a device state estimation apparatus 50 and a device power consumption estimation apparatus 70 of an embodiment.
Figure 2:
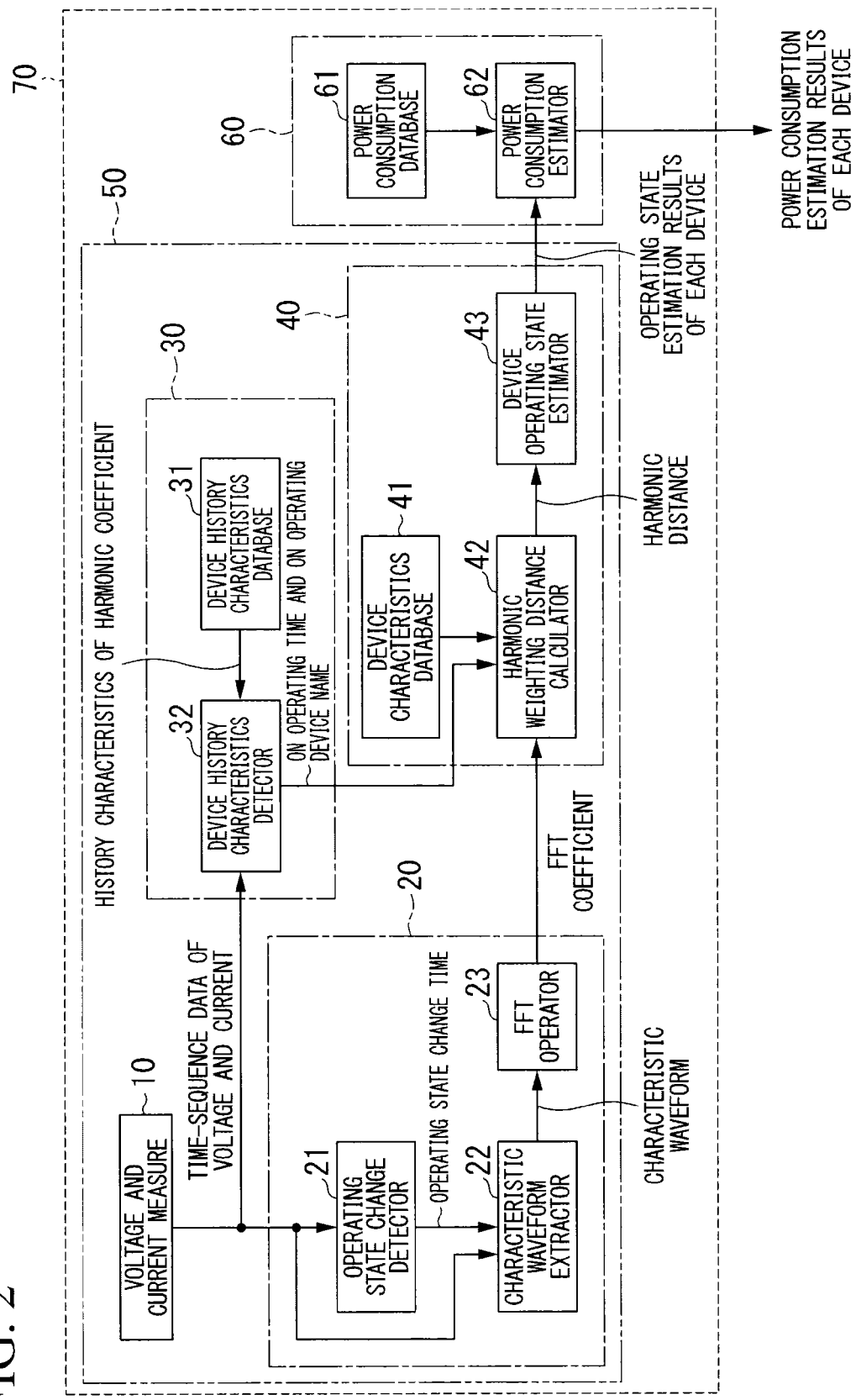
FIG. 2 shows each constituent element of the device state estimation apparatus 50 and the device power consumption estimation apparatus 70 shown in FIG. 1.

A device state estimation apparatus 50 and a device power consumption estimation apparatus 70 of an embodiment will be described below, with references made to the drawings. FIG. 1 shows the constitution of the device state estimation apparatus 50 and the device power consumption estimation apparatus 70 of the embodiment, and FIG. 2 shows each constituent element of the device state estimation apparatus 50 and the device power consumption estimation apparatus 70 shown in FIG. 1.

As shown in FIG. 1, the device state estimation apparatus 50 has a voltage and current measure 10, a harmonic calculator 20, a history characteristics detector 30, and an operating state estimator 40. The device power consumption estimation apparatus 70 has the device state estimation apparatus 50 and a device power consumption estimator 60.

The apparatus of the embodiment has the device state estimation apparatus 50 that estimates the operating state of each home appliance from measurement data of the voltage and current of each home appliance, and the device power consumption estimation apparatus 70 that estimates and outputs the power consumption of each home appliance.

The voltage and current measure 10 measures the voltage on the power feed line and the current flowing in the power feed line at a fixed period, and records the time and time-sequence data of the voltage and current.

As shown in FIG. 2, the harmonic calculator 20 has an operating state change detector 21, a characteristic waveform extractor 22, and an FFT operator 23 (first FFT operator).

The operating state change detector 21 receives the time and the time-sequence voltage and current data as input and, from these data, detects and outputs to the characteristic waveform extractor 22 the operating state change time. The operating state change time refers to a time at which an operating state changes, for example, when a home appliance changes from ON to OFF or OFF to ON and, the time at which the washing machine operating mode changes from "wash" to "rinse". There may not be just one of these operating state change times, but a plurality thereof.

The characteristic waveform extractor 22 extracts a characteristic waveform before and after a change time, from the change times detected by the operating state change detector 21 and from the measurement data of voltage and current.

The FFT operator 23 performs an FFT (fast Fourier transform) on the characteristic current waveform detected by the characteristic waveform extractor 22 and calculates the FFT coefficients of harmonics.

The history characteristics detector 30 has a device history characteristics database 31 and a device history characteristics detector 32.

The device history characteristics database 31 records beforehand the characteristics of the current or power time variations of at least one device. This mainly assumes a device that has an inverter, such inverter operating by PWM or the like, varying the current magnitude and phase, so that the current harmonic components often vary with increase and decrease of the power consumption. When this occurs, each harmonic frequency component often describes a trace such as an arc on the complex plane. The characteristics of this trace are recorded beforehand.

Figure 3:
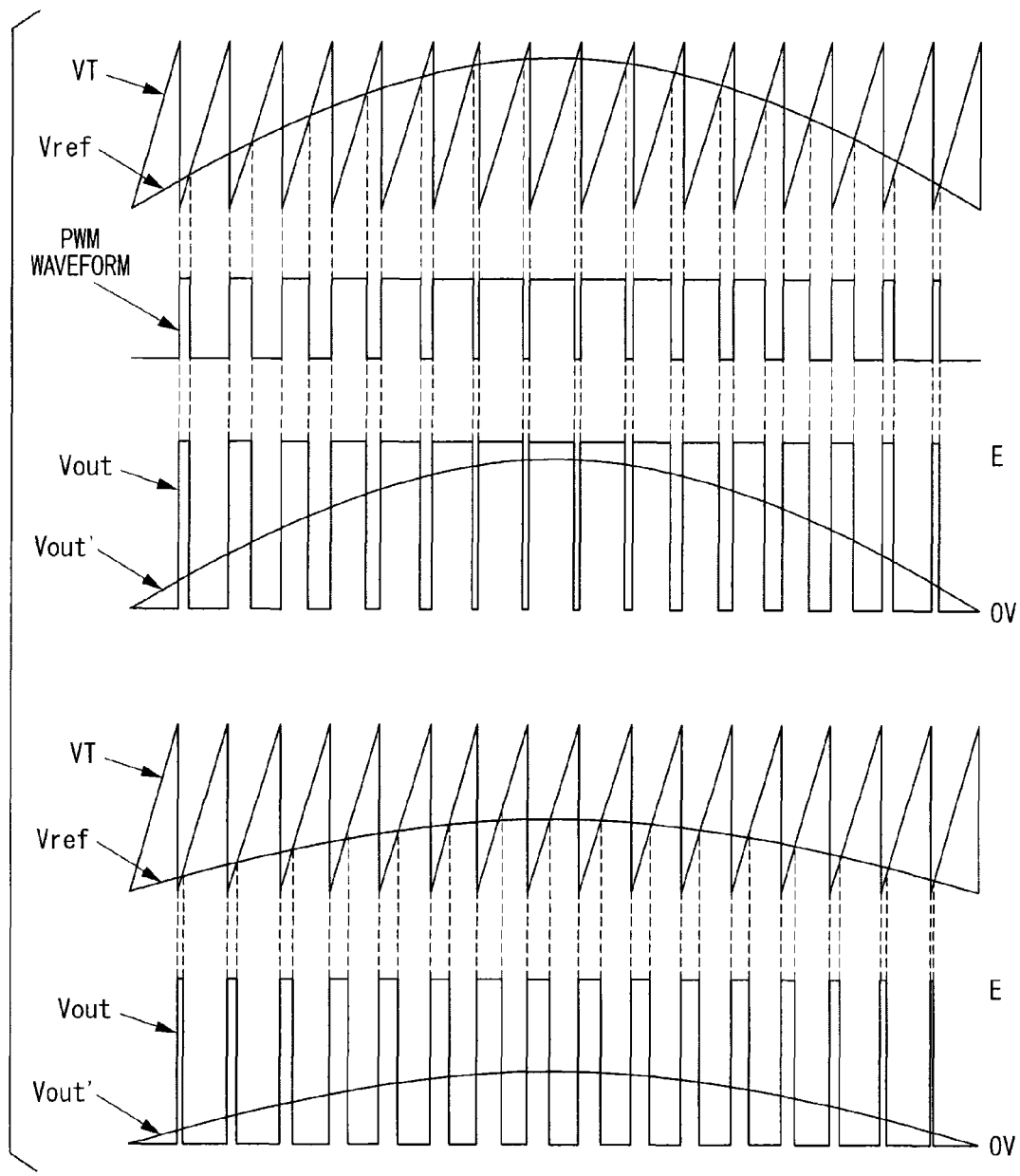
FIG. 3 shows an example of PWM (pulse width modulation) operation in an inverter device.
Figure 4:
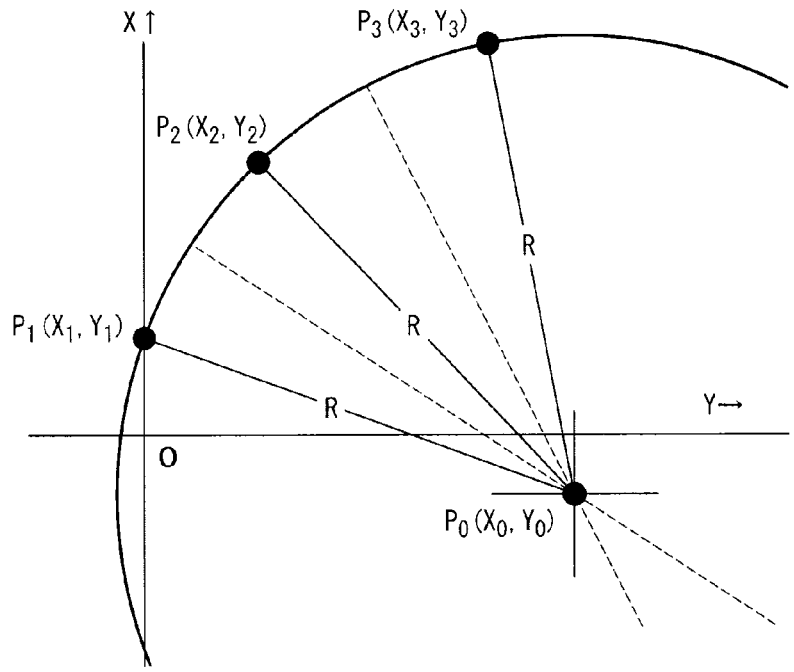
FIG. 4 describes an example of data recorded in a device history characteristics database 31.

FIG. 3 shows an example of PWM operation in inverters, and FIG. 4 describes an example of data recorded into the device history characteristics database 31.

A home appliance not having an inverter has harmonic characteristics in accordance with one operating state. In contrast, in home appliances that have an inverter, the harmonic characteristics vary in accordance with PWM operation or the like.

PWM is a system in which a pulse stream of a large number of pulses (shown as Vout in FIG. 3) is generated during a half-cycle of the output waveform (shown as Vout' in FIG. 3), the equivalent voltage of the pulse widths thereof being made to vary as a sine wave, thereby obtaining a smooth output of Vout' with few low-order harmonics.

Because the phase and amplitude are varied in PWM, in the harmonics characteristic of an inverter home appliance the harmonics describe a curve that passes through the origin. Making use of this characteristic, the trace of each order of harmonic is extracted and it is estimated from the characteristic trace (statistical information of the time-sequence data) which inverter home appliance is being operated. One example of a characteristic of the trace is the center coordinate and radius.

If a plurality of inverters is operating, the center coordinates and radii thereof are taken in the same manner to be the characteristics. If there is no simultaneous PWM operation, each of the respective traces can be extracted separately. However, when there is simultaneous PWM operation, if the characteristics as shown in FIG. 4 are taken to be the center coordinates c, the radii r, and the angular velocities ω, it is possible to synthesize the harmonic trace during simultaneous operation, enabling estimation of multiply operating inverter home appliances by selecting a combined trace that is most similar to the measured trace.

The device history characteristics detector 32 calculates the time-variation characteristics from the time and the time-sequence data of voltage and current, compares the calculated characteristics with information in the device history characteristics database 31, and detects devices in the ON operating state. The ON operating state refers to the state (powered state) in which current is flowing in the device and power is being consumed. That is, the ON state may include both the state in which the device is powered and operating and the state in which the device, although being powered, is not operating (the so-called sleep state, standby state, or other state). In this case as well, the time-variation characteristics are mainly assumed to be the traces of each harmonic component. In comparing the traces stored in the device history characteristics database 31 and the calculated traces, a judgment can be made by coincidence or coincidence within some range between the radii and center coordinates of the arcs.

Figure 5:
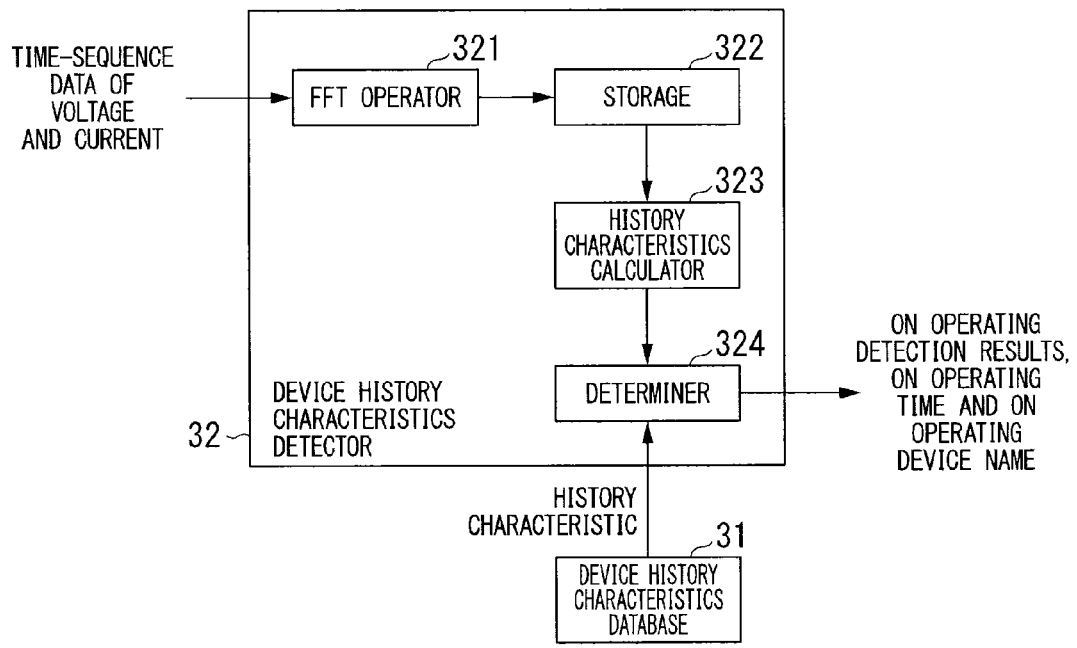
FIG. 5 shows the constitution of the device history characteristics detector 32 shown in FIG. 2.

FIG. 5 shows the constitution of the device history characteristics detector 32 shown in FIG. 2. The device history characteristics detector 32 has an FFT operator 321 (second FFT operator), a storage 322, a history characteristics calculator 323, and a determiner 324.

The FFT operator 321 breaks down the time and the time-sequence data of voltage and current into one or more current or power waveform frequency components. Both these both frequency components and the times are stored into the storage 322. The history characteristics calculator 323 calculates characteristics (frequency characteristics) that represent how the frequency components vary with time, from the time and current or power frequency components read out from the storage 322. The determiner 324 compares the time-variation characteristics of the device current or power output by the device history characteristics database 31 and the characteristics output by the history characteristics calculator 323 and, if there is coincidence, takes that a device to be in the ON operating state and outputs the name of that device along with the time.

The operating state estimator 40 has a device characteristics database 41 (device characteristics database), a harmonic weighting distance calculator 42, and a device operating state estimator 43.

The FFT coefficients of harmonics of each operating state of each home appliance are recorded into the device characteristics database 41 beforehand, and data is output to the harmonic weighting distance calculator 42.

The harmonic weighting distance calculator 42 calculates the weighting distance of the calculated FFT harmonic coefficients of the current waveform and the FFT harmonic coefficients of each operating state of each home appliance read out from the device characteristics database 41. Because determining the distances for all operating states increases the amount of calculation and the size of memory, the ON operating device information detected by the device history characteristics detector 32 is used to calculate the harmonic weighting distance for only operating states of all the operating states that match the ON operating device information.

The device operating state estimator 43 selects and outputs the operating state that best matches the state of the harmonics of the operating state having the smallest distance, from the weighting distances calculated by the harmonic weighting distance calculator 42.

The device power consumption estimator 60 has a power consumption database 61 and a power consumption estimator 62.

A regression model obtained from the relationship between the FFT harmonic coefficients of each operating state and the power consumption of each home appliance is stored into the power consumption database 61 beforehand and output to the power consumption estimator 62.

The power consumption estimator 62, based on the operating state output by the device operating state estimator 43, reads out the corresponding regression model from the power consumption database 61 and estimates and outputs the power consumption.

Figure 6:
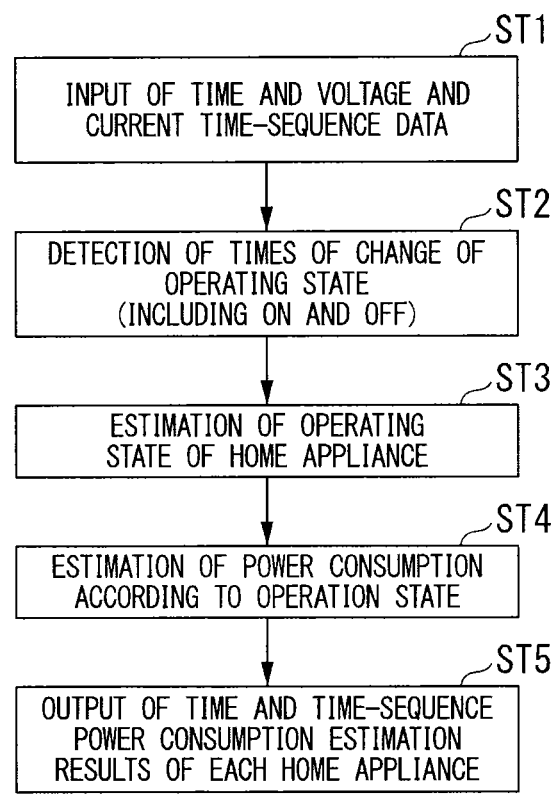
FIG. 6 is a flowchart showing the overall flow of power consumption estimation processing in the device power consumption estimation apparatus 70 of the embodiment.
Figures 7A, 7B, 7C:
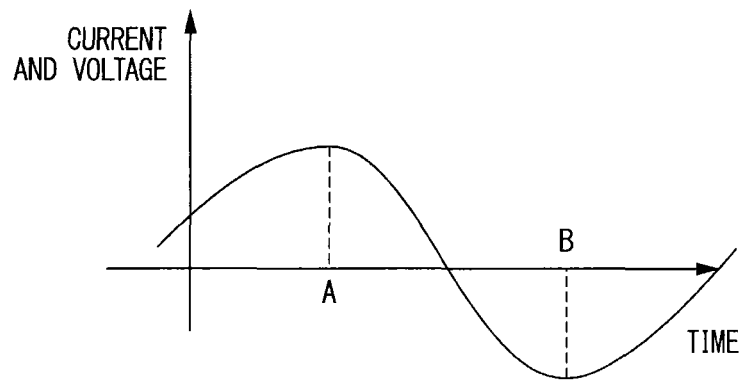
FIG. 7A shows an example of time-sequence data of current and voltage in the flowchart of FIG. 6.
FIG. 7B shows an example of operating state change time data in the flowchart of FIG. 6.
FIG. 7C shows an example of time-sequence estimation results of the operating state in the flowchart of FIG. 6.

Next, the power consumption estimation processing in the device power consumption estimation apparatus 70 of the present embodiment will be described, with references made to the drawings. FIG. 6 is a flowchart showing the overall flow of power consumption estimation processing in the device power consumption estimation apparatus 70 of the present embodiment, and FIG. 7A through FIG. 7D show an example of the processing data in the flowchart of FIG. 6.

The voltage and current measure 10 inputs the recorded times, along with the time-sequence data of voltage and current (time-sequence data shown in FIG. 7A) to the operating state change detector 21 (step ST1).

The operating state change detector 21, from the times and the voltage and current time-sequence data, detects the times of changes in the operating state (the change times in the operating state shown in FIG. 7B) and outputs the times of change of the operating state to the characteristic waveform extractor 22 that follows (step ST2).

The input of the characteristic waveform extractor 22 is the time and the voltage and current time-sequence data and the times of changes in operating state detected by the operating state change detector 21. The harmonic weighting distance calculator 42 compares the voltage and current data before and after the times of change in the operating state to estimate the home appliance that changed its operating state. If there is a plurality of operating state change times, the same processing is performed with respect to all the times. As a result, the device operating state estimator 43 calculates the results of time-sequence estimation of the times and operating states (time-sequence estimation results shown in FIG. 7C) for each home appliance, and outputs these to the power consumption estimator 62 that follows (step ST3, described in detail below).

The input of the power consumption estimator 62 is the times and the operating state time-sequence estimation results for each home appliance calculated by the device operating state estimator 43. A power consumption estimation model corresponding to the operation state is prepared in the power consumption database 61 beforehand, and the power consumption estimator 62 uses the model to estimate the power consumption (step ST4). The power consumption estimator 62 outputs the time and the time-sequence power consumption estimation results for each home appliance (the time and power consumption time-sequence estimation results shown in FIG. 7D) (step ST5).

Next, each of the above-noted steps ST2 to ST4 will be described in detail.

[Operating State Change Time Detection Processing]

Figure 8:
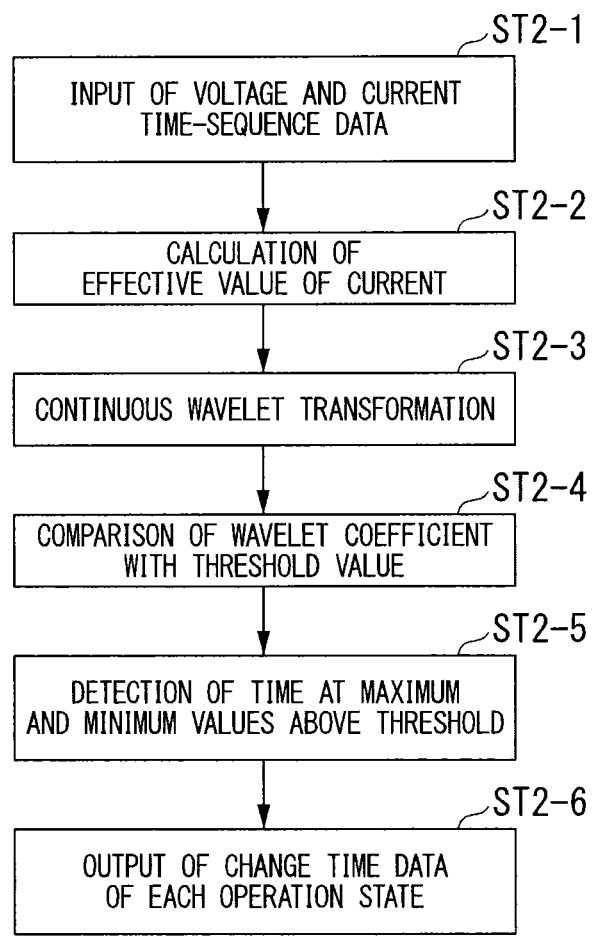
FIG. 8 is a flowchart showing the flow of detection processing of the change time of the operating state in the flowchart of FIG. 6.

FIG. 8 is a flowchart showing the flow of processing to detect the operating state change times (step ST2) in the flowchart of FIG. 6, and FIG. 9A through FIG. 9C show an example of the processing data in the flowchart of FIG. 8.

All of each part of the processing in this flow is performed in the operating state change detector 21.

The voltage and current measure 10 inputs the recorded times along with the time-sequence data of voltage and current (time-sequence data shown in FIG. 9A) to the operating state change detector 21 (step ST2-1).

The operating state change detector 21 calculates the effective value of the current (time-varying data of the current effective value shown FIG. 9B) from the current time-sequence data (step ST2-2). The calculation interval used in calculating the effective value may be arbitrary. For example, although the shorter the calculation interval is the better is the time resolution when estimating the operating state or power consumption, the amount of operation increases. In contrast, although a lengthened interval reduces the detection error rate, operating state changes that need to be detected cannot be detected, thereby reducing the estimation accuracy.

The operating state change detector 21 performs a continuous wavelet transformation on the time-sequence data of the current effective value (step ST2-3). This transformation enables capture of current variations. By capturing changes in the current, it can be thought that all changes including not only the ON and OFF states of the home appliance, but also changes in the power consumption of an inverter home appliance and changes in the operating mode of a continuously operating home appliance can be detected.

Figure 9A:
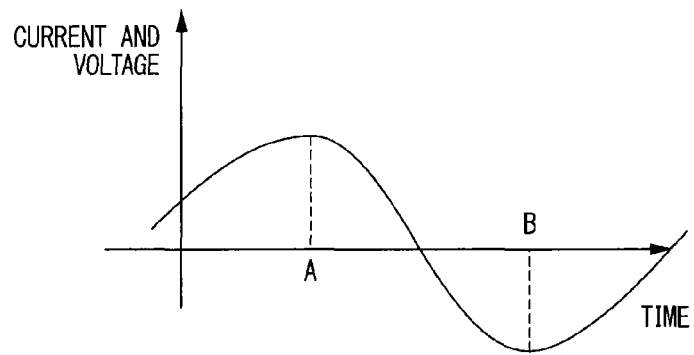
FIG. 9A shows an example of time-sequence data of current and voltage in the flowchart of FIG. 8.
Figure 9B:
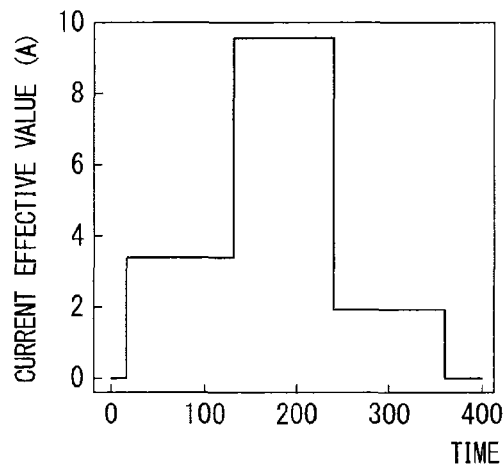
FIG. 9B shows an example of time-varying data of the current effective value in the flowchart of FIG. 8.
Figure 9C:
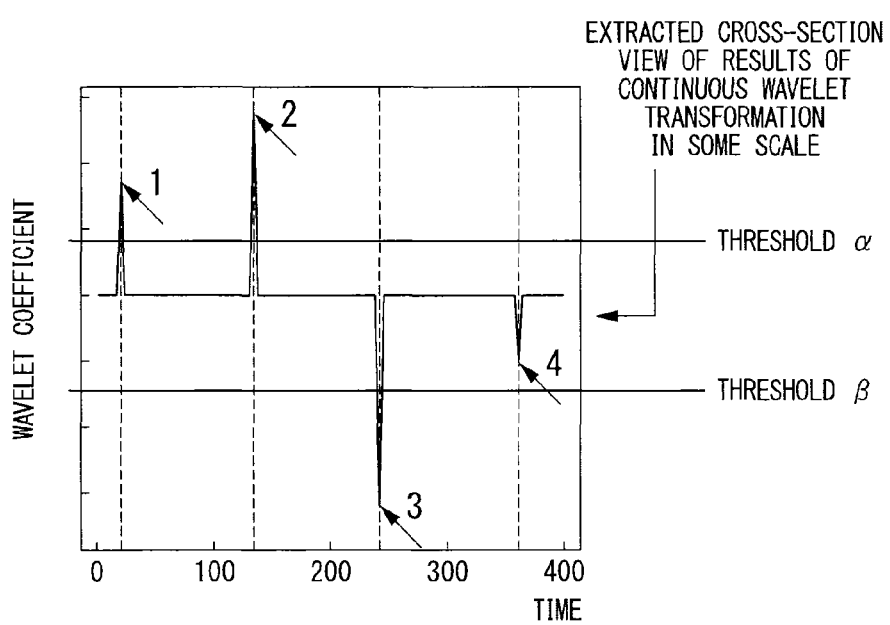
FIG. 9C shows an example of a cross-sectional view obtained by extracting the wavelet coefficient in the flowchart of FIG. 8 in the time direction.

From the results of the continuous wavelet transformation, the operating state change detector 21 extracts the wavelet coefficients in the time direction in some scale the extracted cross-section view is shown in FIG. 9C) and compares the wavelet coefficients with a threshold value (step ST2-4). An arbitrary value may be used for the scale. By expanding and contracting the wavelet basis function, the smaller the scale, the more the wavelet coefficients change in response to a current change having a small time constant. In contrast, if the scale is large, the wavelet coefficients change in response to a current change having a large time constant and the wavelet coefficients do not change with a current change having a small time constant. Therefore, adjusting this scale enables control of the time constant of current change to be detected. Also, the size of the wavelet coefficient relates to the amount of current change. Therefore, the threshold is set and a comparison is made with the threshold, thereby enabling control of the amount of current change to be detected. A positive wavelet coefficient indicates an increase in current and a negative wavelet coefficient indicates a decrease in current. Given this, to detect an increase in current, a positive threshold is set, and to detect a decrease in current, a negative threshold is set.

Because the operating state changes at the time at which the wavelet coefficient is maximum, the operating state change detector 21 determines the time at an apex of a convex part at which the wavelet coefficient is judged as been larger or smaller than the threshold (step ST2-5).

The operating state change detector 21 outputs the detected time as the operating state change time (step ST2-6). If there is a plurality of operating state change times, the change times for the plurality of operating state changes are output.

[Home Appliance Operating State Estimation Processing]

Figure 10:
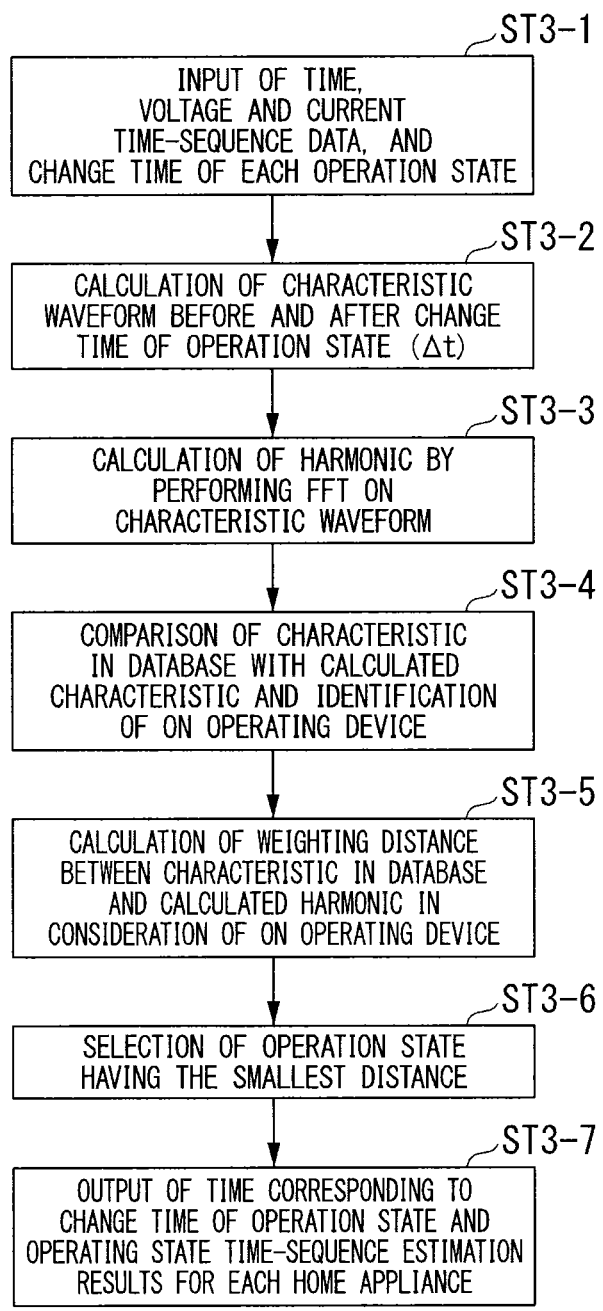
FIG. 10 is a flowchart showing the flow of processing to estimate the operating state of a home appliance in the flowchart of FIG. 6.
Figure 11A:
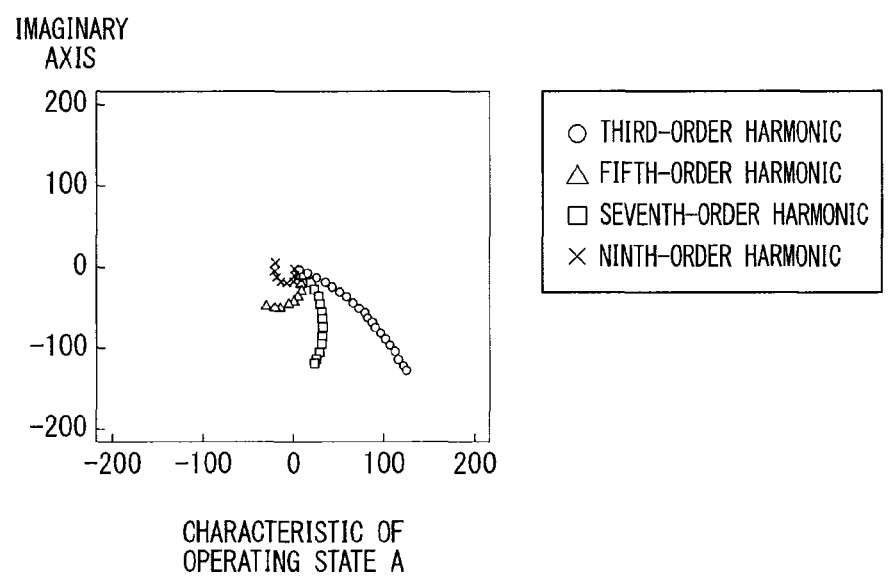
FIG. 11A shows an example of characteristics recorded in the device history characteristics database 31 in the flowchart of FIG. 10.
Figure 11B:
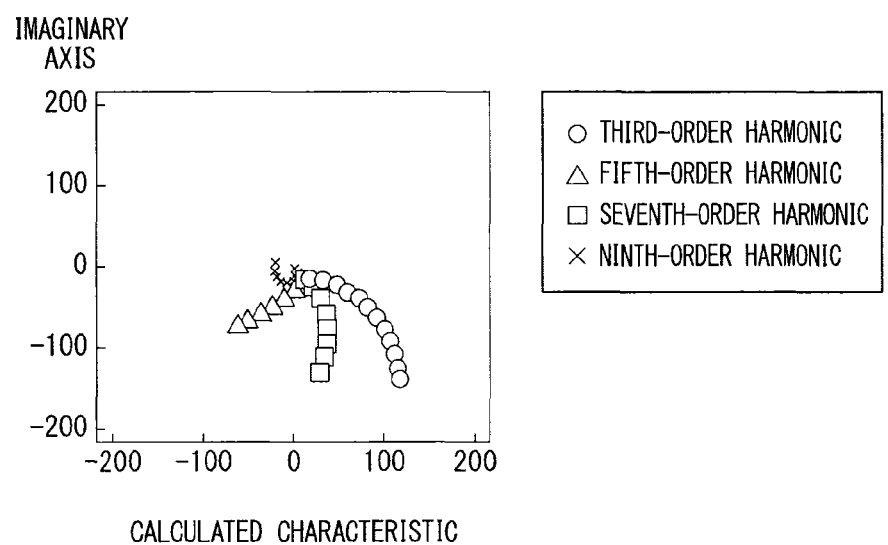
FIG. 11B shows an example of calculated characteristics of the time variation in the flowchart of FIG. 10.
Figure 11C:
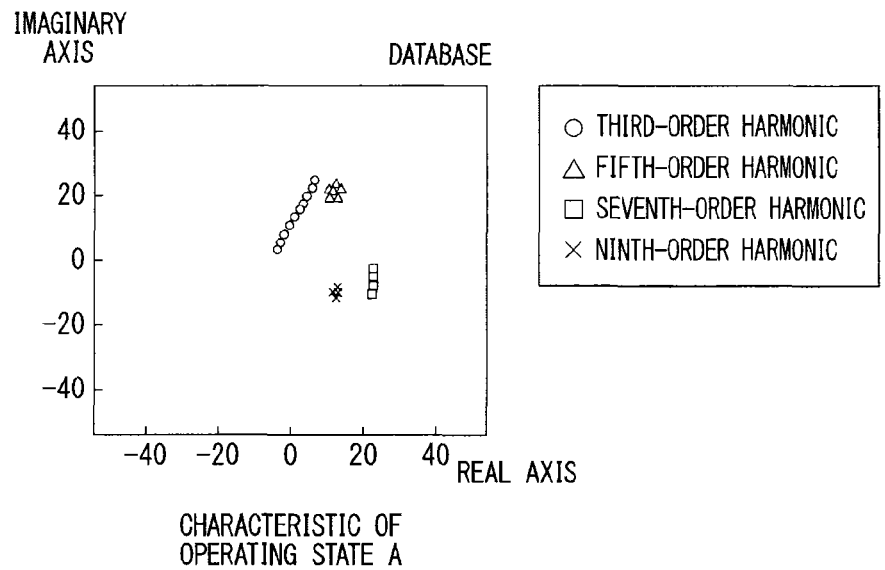
FIG. 11C shows an example of characteristics recorded in the device characteristics database 41 in the flowchart of FIG. 10.
Figure 11D:
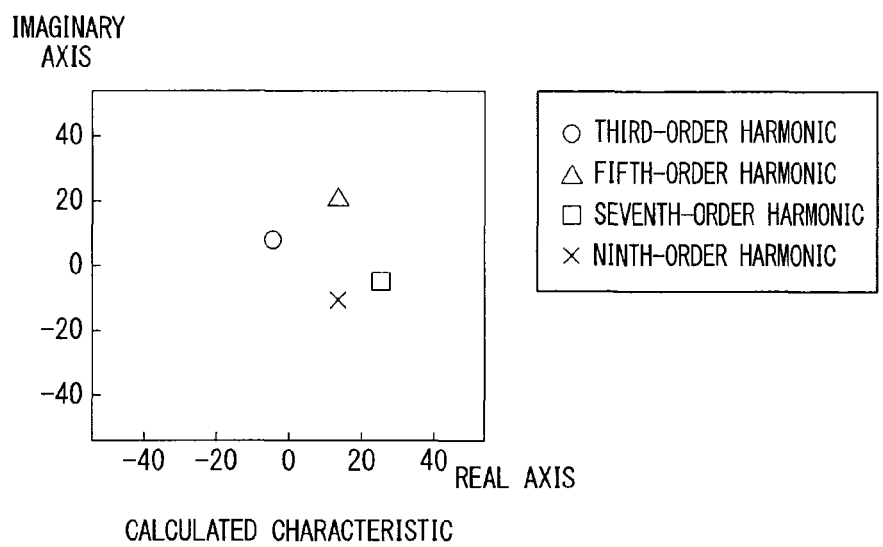
FIG. 11D shows an example of harmonic data calculated in the flowchart of FIG. 10.
Figure 12A:
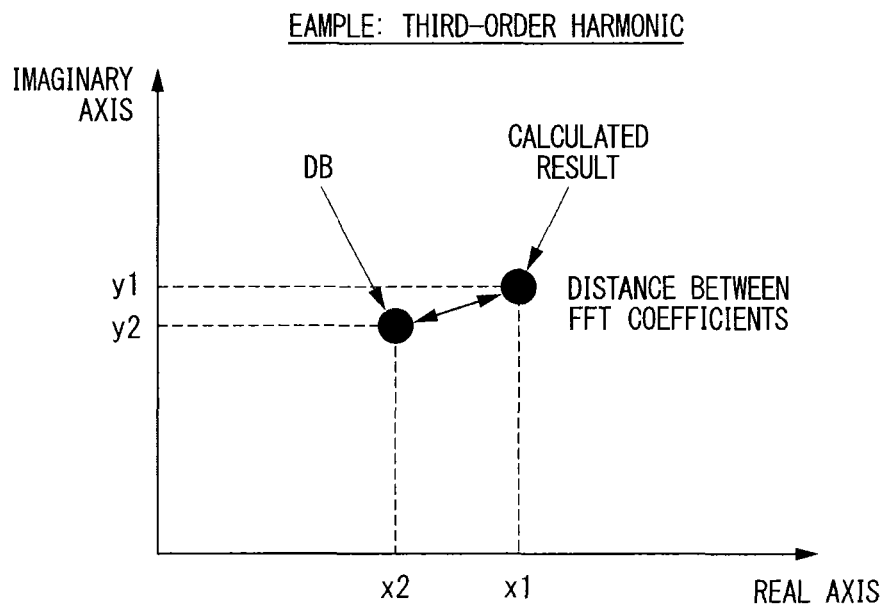
FIG. 12A shows an example of a distance calculation method in the flowchart of FIG. 10.
Figure 12B:
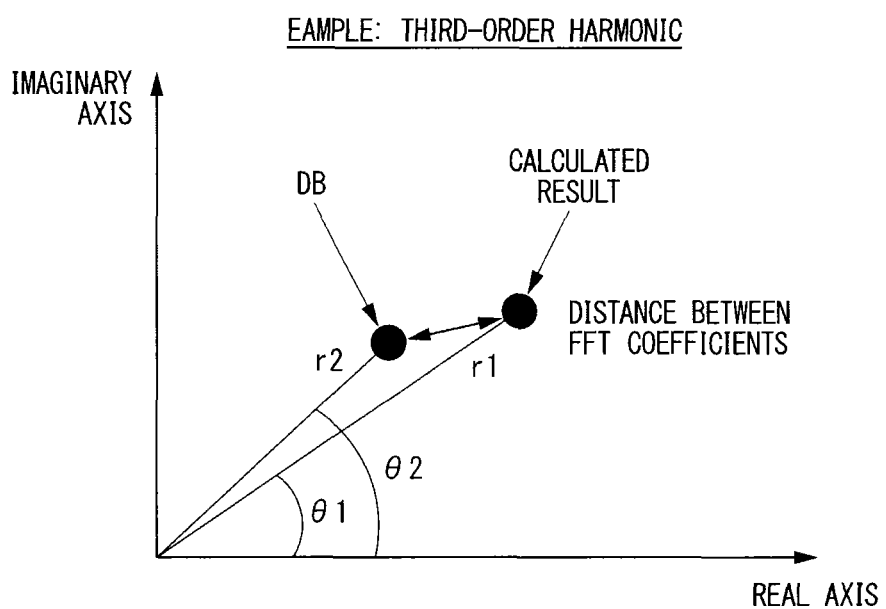
FIG. 12B shows an example of a distance calculation method in the flowchart of FIG. 10.

FIG. 10 is a flowchart showing the flow of processing to estimate the operating state of a home appliance in the flowchart of FIG. 6 (step ST3). FIG. 11A through FIG. 11D show an example of the processing data in the flowchart of FIG. 10, and FIG. 12A and FIG. 12B show examples of the method of distance calculation in the flowchart of FIG. 10.

The operating state change times and the time-sequence data of the voltage and current are input to the characteristic waveform extractor 22 (step ST3-1).

The characteristic waveform extractor 22 calculates and compares the characteristic waveforms before and after the time of change in the operating state (step ST3-2). When doing that, because instability makes it difficult to capture the characteristic of a waveform during a change in the operating state, the waveform during the change is not used. For this reason, the waveforms $\Delta t$ before and $\Delta t$ after the time of the change in the operating state are compared. This time $\Delta t$ must be determined considering the time constant of the operating state change, so that the waveform during the change is not referenced.

The method of extracting a current differential waveform before and after the time of change is as follows.

(1) With regard judgment of a change in home appliance device from OFF to ON or ON to OFF, extraction is done as the differential waveform between the waveforms before and after the change time.

(2) The judgment of a change in the operating state of a home appliance in the ON operating state is made by determining all combinations of differences between the waveform after the change time and the total of the waveforms of (N−1) ON operating states.

In order to evaluate the possibility of all operating state changes in subsequent steps, the characteristic waveforms for all case are calculated in this step.

The FFT operator 23 performs an FFT on all of the current characteristic waveforms calculated by the characteristic waveform extractor 22 and calculates the harmonics (step ST3-3). For the current data, the voltage waveform is referenced, and the waveform is extracted from the time at which the voltage phase is zero. By referencing the voltage, the fundamental phase is adjusted and, as a result of this processing, the phase change of the fundamental can also be used as reference information when estimating the operating state.

From the times and the voltage and current time-sequence data, the device history characteristics detector 32 calculates the time-varying characteristics and compares the calculated characteristics (shown in FIG. 11B) with information in the device history characteristics database 31 (shown in FIG. 11A), and detects a device that is in the ON operating state (step ST3-4). This mainly assumes a device that has an inverter, in which the harmonic components of the current often vary together with an increase and decrease of the power consumption. When this occurs, each harmonic frequency component often describes a trace such as an arc on the complex plane. Given this, to identify the ON operating device, a judgment can be made regarding coincidence or coincidence within some range between the radii and center coordinates of the calculated arcs and the values in the device history characteristics database 31. Arcs having a large radius for low-order harmonics can be treated as vectors that are straight-line approximations thereof.

If a plurality of inverters is operating, if the characteristics are taken to be the center coordinates, the radii, and the angular velocities, it is possible to synthesize the harmonic trace during multiple operation, enabling estimation of a plurality of operating inverter home appliances by selecting a trace that is most similar to the measured trace.

The harmonic weighting distance calculator 42 considers the ON-state device and calculates the weighting distance between the characteristics in the device characteristics database 41 (shown in FIG. 11C) and the calculated harmonics (shown in FIG. 11D) (step ST3-5).

As indicated by the Euclidean distance on the complex plane in FIG. 12A, with the distance for each order of harmonic taken as being (x1−x2)+(y1−y2), the distances between the calculation result (FFT coefficients) and the characteristics in the device characteristics database 41 being calculated. The calculated distances for each order are accumulated and taken as the final distance. Alternatively, as shown in FIG. 12B, the harmonic FFT coefficients calculated in the FFT operator 23 are plotted on polar coordinates and, taking the distance as being separated between a phase and the size of an absolute value, each distance is calculated and each is multiplied by the weight α and β coefficients to calculate the distance. For each order of harmonic, polar coordinates are used, the distance being taken as α×abs(r1−r2)+β×(Φ1−Φ−2), and the weighting distance between the calculation results (FFT coefficients) and the characteristics in the device characteristics database 41 being calculated. Although the α and β are arbitrary, they may be varied in accordance with the characteristics of the home appliance. The value of β may be made large to place weight on the phase.

When calculating the distance, if the distance is calculated with respect to all operating states, because the amount of calculation and the memory size become large, the ON operating state device information detected by the device history characteristics detector 32 is used. Of all of the operating states, the distance is calculated for only operating states matching the ON operating state information. This enables not only a reduction of the amount of calculation and the memory size, but also a reduction in the estimation errors, thereby improving the estimation accuracy.

The device operating state estimator 43 compares the weighting distances calculated by the harmonic weighting distance calculator 42, selects an operating state having the smallest distance (step ST3-6), and outputs this as the estimation result. By doing this, the device operating state estimator 43 outputs the time corresponding to the change time and the operating state time-sequence estimation results for each home appliance (step ST3-7).

[Estimation of Power Consumption in Accordance with the Operating State]

The power consumption estimator 62, from the time and the operating state time-sequence estimation results for each home appliance calculated by the device operating state estimator 43, reads out a corresponding power consumption model from the power consumption database 61.

Figure 13:
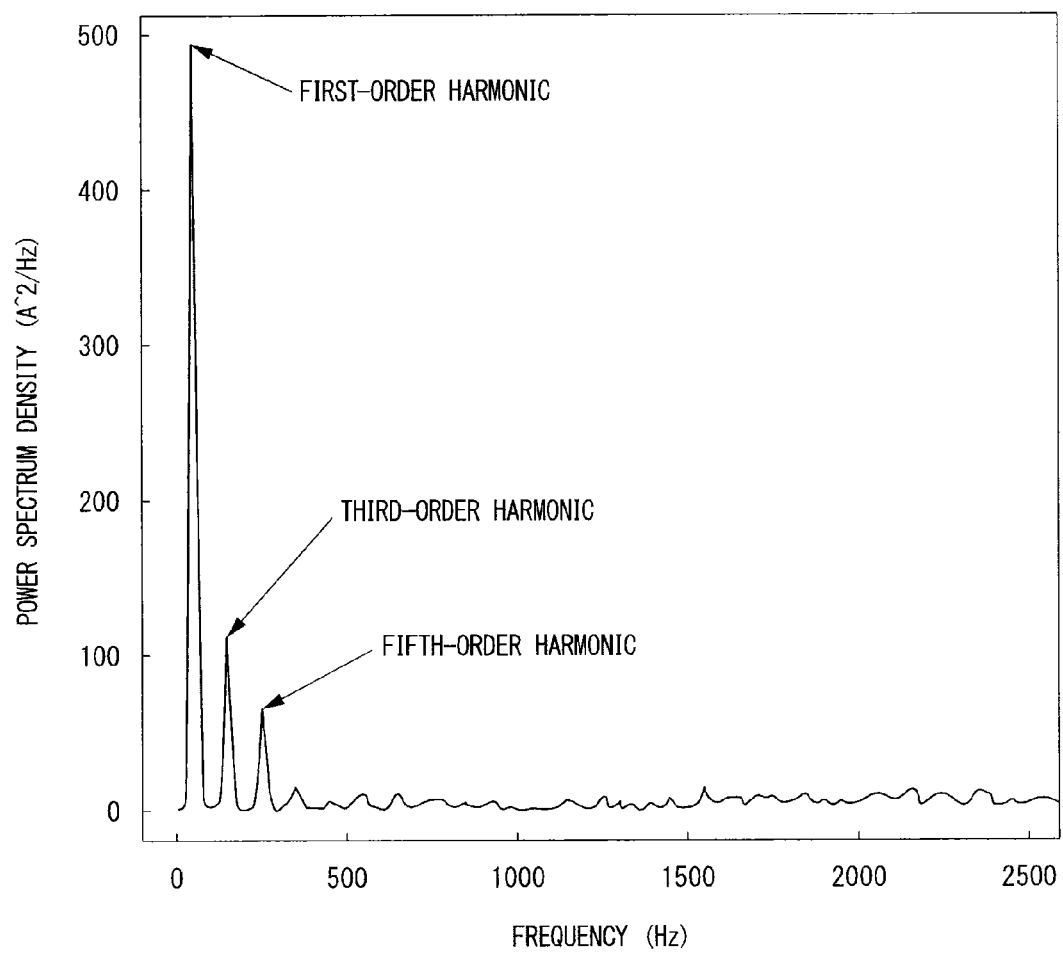
FIG. 13 describes a power consumption estimation model in the power consumption estimation processing in accordance with the operating state in the flowchart of FIG. 6.

FIG. 13 describes the power consumption estimation model in the power consumption estimation processing (step ST4) in accordance with the operating state in the flowchart of FIG. 6. As shown in FIG. 13, because much of the current is made up of the first-, third-, and fifth-order components, the power consumption can be expressed by a regression model of the first-, third-, and fifth-order harmonic components of current. That is, because the power consumption of the home appliance has a high correlation with the power spectrum of the various orders, and particularly the low orders, of harmonics, this can be utilized in using a regression model relating the harmonic power spectrum and the power consumption. Because the device operating state estimator 43 outputs the time and the operating states, from the harmonic information during the operating state, the power spectrum is calculated and the power consumption is calculated from this and the regression model.

By the constitution of the above-described embodiment, when a plurality of home appliances is simultaneously operating, it is possible to reduce an increase in the amount of calculations and the memory size and the occurrence of estimation errors caused by an increase in the number of combinations of operating states of the plurality of target devices. In this manner, by limiting the combined states of the home appliance beforehand, detection errors by the device state estimation apparatus 50 can be reduced, and the accuracy of power consumption estimation by the device power consumption estimation apparatus 70 can be improved.

Figure 14:
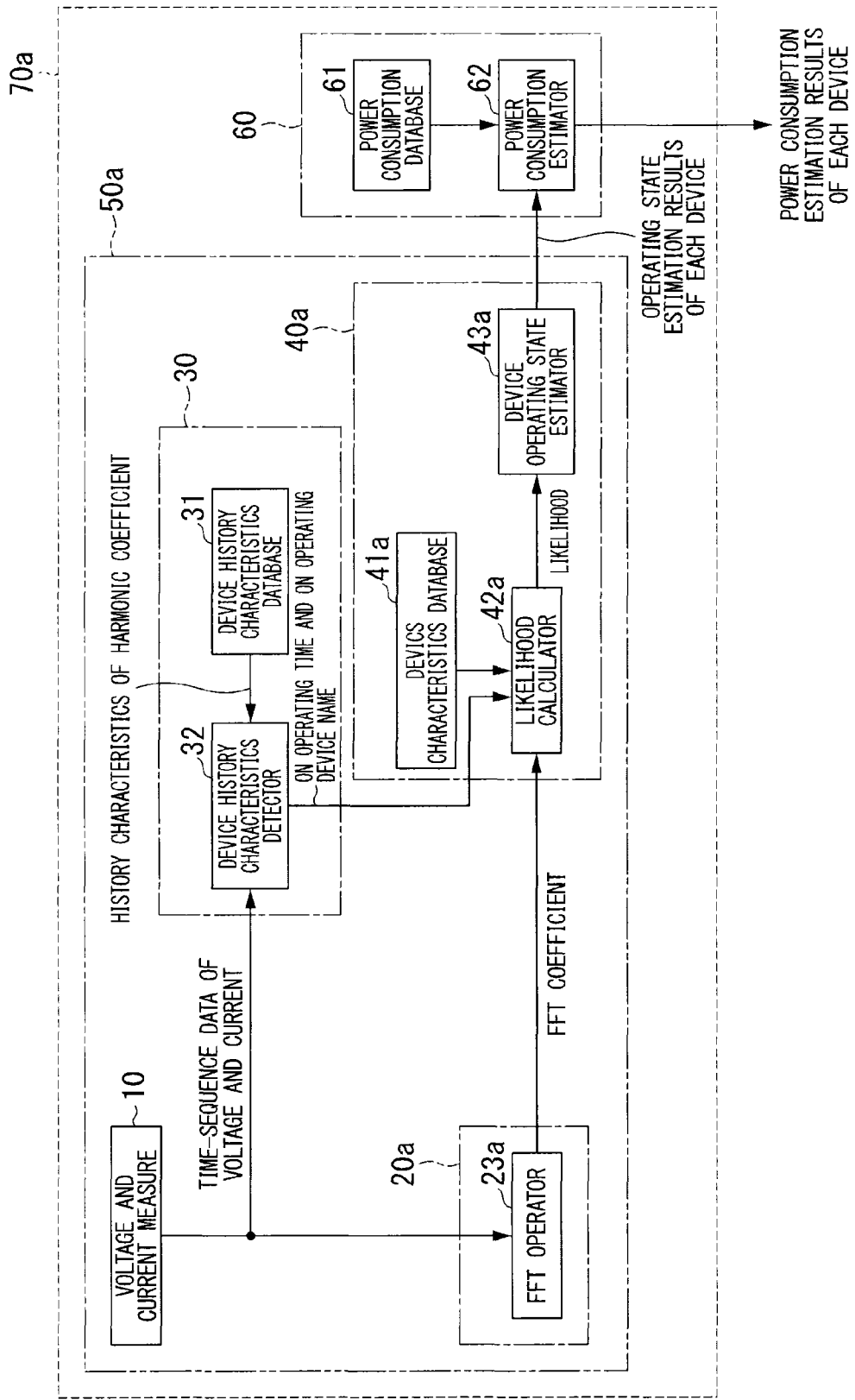
FIG. 14 shows the constitution of a device state estimation apparatus 50a and a device power consumption estimation apparatus 70a of an embodiment.

Continuing, the device state estimation apparatus 50*a* and the device power consumption estimation apparatus 70*a* of the present embodiment will be described, with references made to the drawings. FIG. 14 shows the constitution of the device state estimation apparatus 50*a* and the device power consumption estimation apparatus 70*a* of the present embodiment. In FIG. 14, parts that are the same as ones in FIG. 2 are assigned the same reference numerals and the description thereof might be omitted.

As shown in FIG. 14, the device state estimation apparatus 50*a* has a voltage and current measure 10, a harmonic calculator 20*a*, a history characteristics detector 30, and an operating state estimator 40*a*. The device power consumption estimation apparatus 70*a* has the device state estimation apparatus 50*a* and a device power consumption estimator 60.

The apparatus of the present embodiment has the device state estimation apparatus 50*a* that estimates the operating state of each home appliance from measurement data of the voltage and current of each home appliance, and the device power consumption estimation apparatus 70*a* that estimates and outputs the power consumption of each home appliance.

The voltage and current measure 10 and the history characteristics detector 30 are the same as those of the device state estimation apparatus 50, and the device power consumption estimator 60 is the same as that of the device power consumption estimation apparatus 70.

The harmonic calculator 20*a* has an FFT operator 23*a* (first FFT operator). The FFT operator 23*a* performs an FFT on the current or voltage waveform and calculates the FFT coefficients of harmonics.

The operating state estimator 40*a* has a device characteristics database 41*a*, a likelihood calculator 42*a*, and a device operating state estimator 43*a*.

The device characteristics database 41*a* records beforehand the FFT coefficients of harmonics of each operating state of each home appliance and outputs the data to the likelihood calculator 42*a*. The difference between this and the device characteristics database 41 is that the device characteristics database 41*a* records information of the distribution of the harmonic components or distribution of the FFT coefficients of each operating state. For example, if this distribution is a normal distribution, the mean value and the deviation or variance are recorded into the device characteristics database 41*a* and output to the likelihood calculator 42*a*.

The likelihood calculator 42*a* generates a likelihood function of each operating state of each home appliance read out from the device characteristics database 41*a* and calculates the likelihood of the calculated current waveform harmonics. Because determining the likelihood for all operating states increases the amount of calculation and the memory size, the ON operating device information detected by the device history characteristics detector 32 is used to calculate the likelihood for only operating states of all the operating states that match the ON operating device information.

Figure 15:
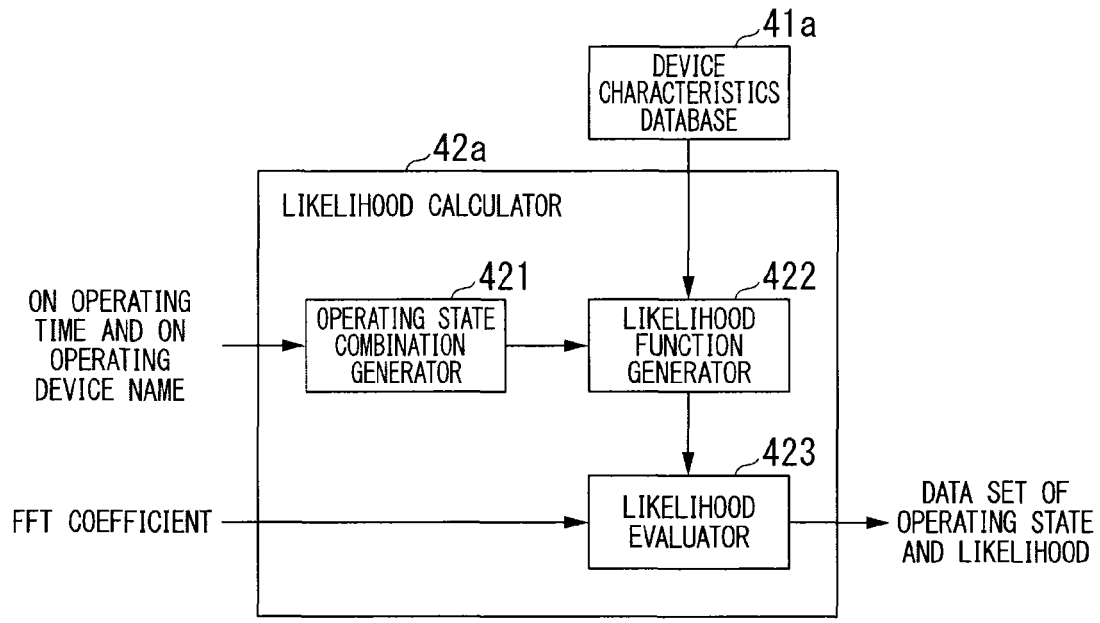
FIG. 15 shows the constitution of the likelihood calculator 42a shown in FIG. 14.

FIG. 15 shows the constitution of the likelihood calculator 42*a* shown in FIG. 14.

The likelihood calculator 42*a* has an operating state combination generator 421, a likelihood function generator 422, and a likelihood evaluator 423.

The operating state combination generator 421 generates, from among combinations of all device operating states, candidates for operating state combinations matching ON operating state devices output by the device history characteristics detector 32.

The likelihood function generator 422 generates, with respect to the combination candidates, a likelihood function from the characteristics of each operating state of each home appliance read out from the device characteristics database 41*a*.

The likelihood evaluator 423 uses the likelihood function to calculate the likelihood of the calculated harmonics and outputs these as sets, combined with the operating states.

The device operating state estimator 43*a* selects an operating state having the largest likelihood from among the likelihoods calculated by the likelihood calculator 42*a*, and outputs that operating state.

Figure 16:
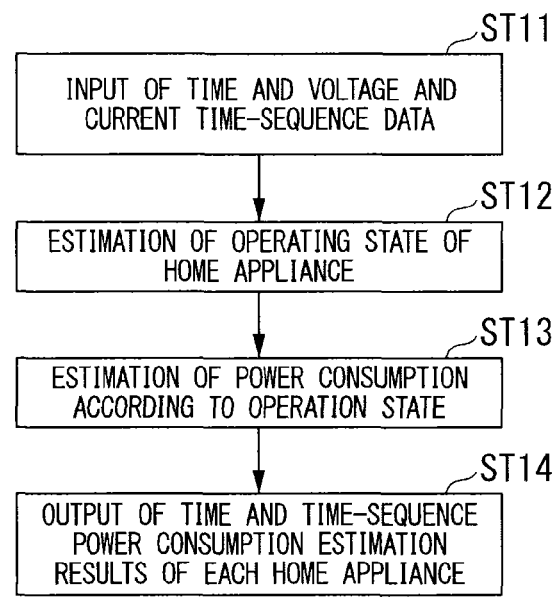
FIG. 16 is a flowchart showing the overall flow of power consumption estimation processing in the device power consumption estimation apparatus 70a of the embodiment.
Figures 17A, 17B, 17C:
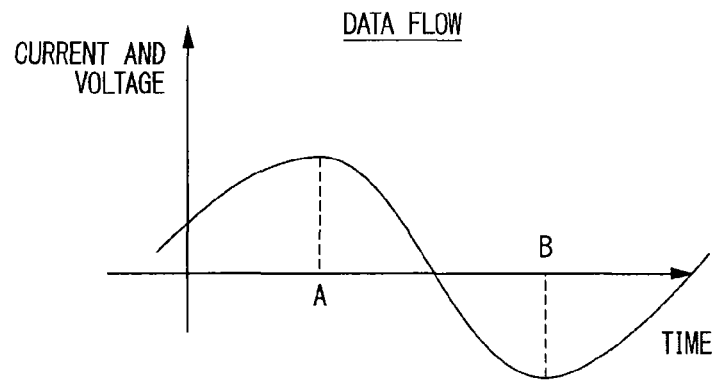
FIG. 17A shows an example of time-sequence data of current and voltage in the flowchart of FIG. 16.
FIG. 17B shows an example of time-sequence estimation results of the operating state in the flowchart of FIG. 16.
FIG. 17C shows an example of results of time-sequence estimation of the power consumption in the flowchart of FIG. 16.

Next, the power consumption estimation processing by the device power consumption estimation apparatus 70*a* of the present embodiment will be described, with references made to the drawings. FIG. 16 is a flowchart showing the overall flow of power consumption estimation processing in the device power consumption estimation apparatus 70*a* of the present embodiment, and FIG. 17A through FIG. 17C show an example of the processing data in the flowchart of FIG. 16.

The voltage and current measure 10 inputs the recorded times and voltage and current time-sequence data (time-sequence data in FIG. 17A) to the FFT operator 23*a* and the device history characteristics detector 32 (step ST11).

The input of the FFT operator 23*a* and the device history characteristics detector 32 is the time and the time-sequence data of the voltage and current. The device operating state estimator 43*a* estimates the operating states for each time, calculates the time and the time-sequence estimation results (time-sequence estimation results shown in FIG. 17B) of the operating states for each home appliance, and outputs these to the power consumption estimator 62 that follows (step ST12, to be described in detail later).

The input of the power consumption estimator 62 is the time and the time-sequence estimation results for operating states for each home appliance calculated by the device operating state estimator 43*a*. A power consumption estimation model corresponding to the operating states is prepared in the power consumption database 61, and the power consumption estimator 62 estimates the power consumption using this model (step ST13). The power consumption estimator 62 outputs the times and the time-sequence estimation results for power consumption for each home appliance (times and power consumption time-sequence estimation results for each home appliance shown in FIG. 17C) (step ST14).

Next, the step ST12 will be described in detail.

[Estimation Processing of the Operating State of a Home Appliance]

Figure 18:
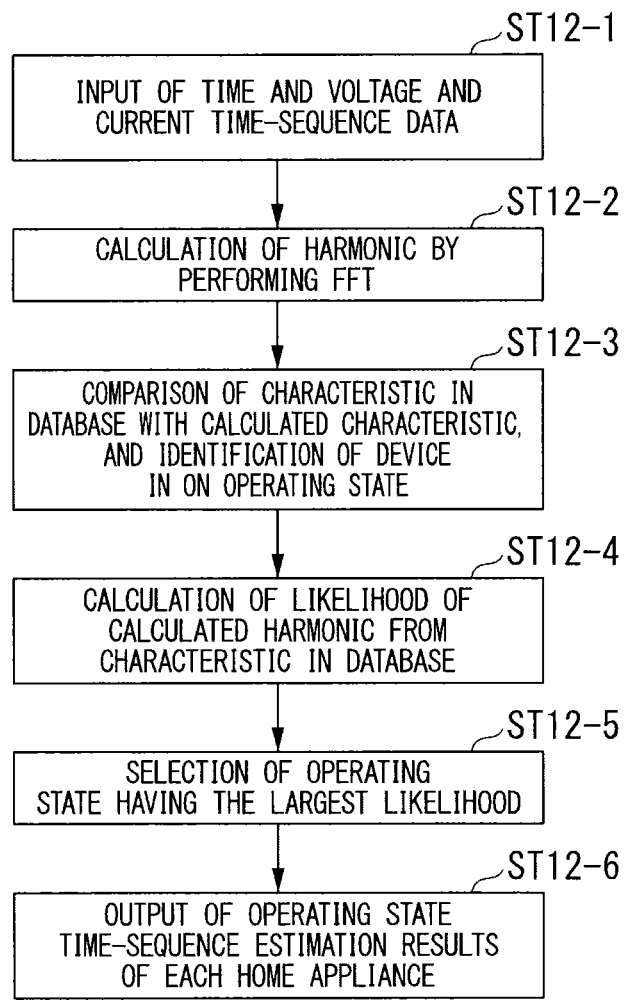
FIG. 18 is a flowchart showing the flow of estimation processing of the operating state of a home appliance in the flowchart of FIG. 16.
Figure 19A:
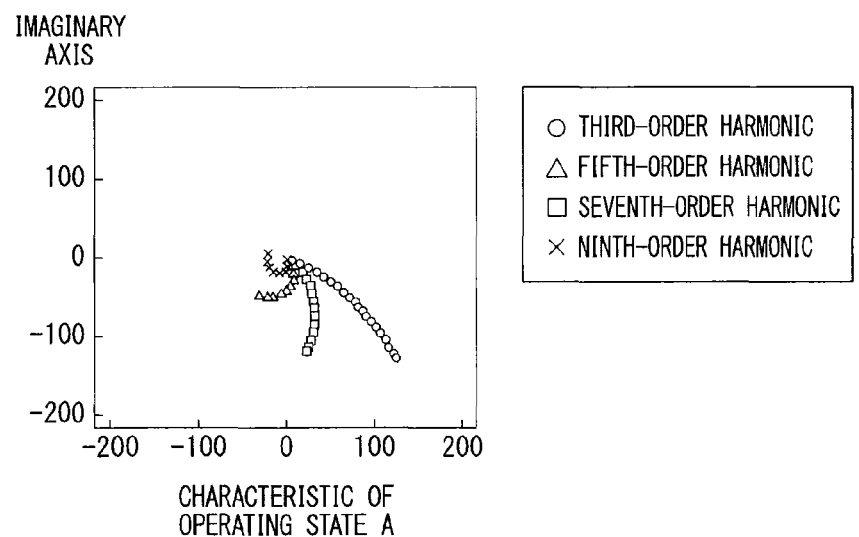
FIG. 19A shows an example of characteristics recorded in the device history characteristics database 31 in the flowchart of FIG. 18.
Figure 19B:
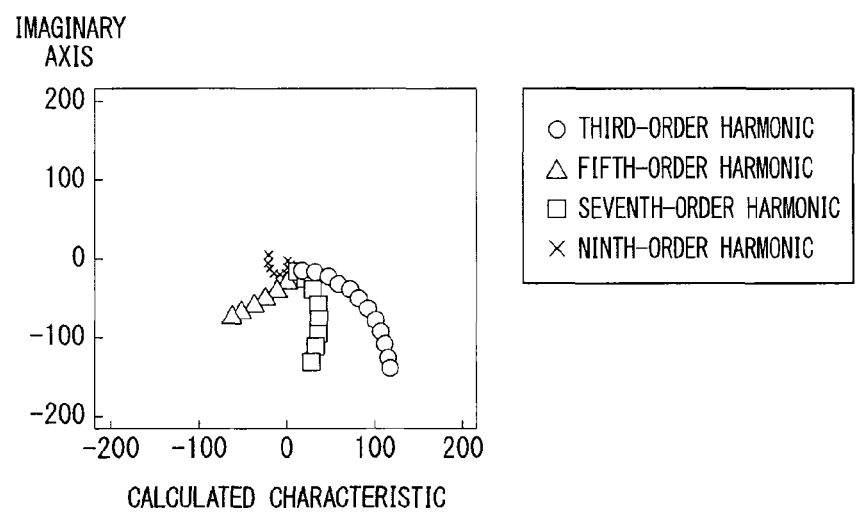
FIG. 19B shows an example of the calculated time variation characteristics in the flowchart of FIG. 18.
Figure 19C:
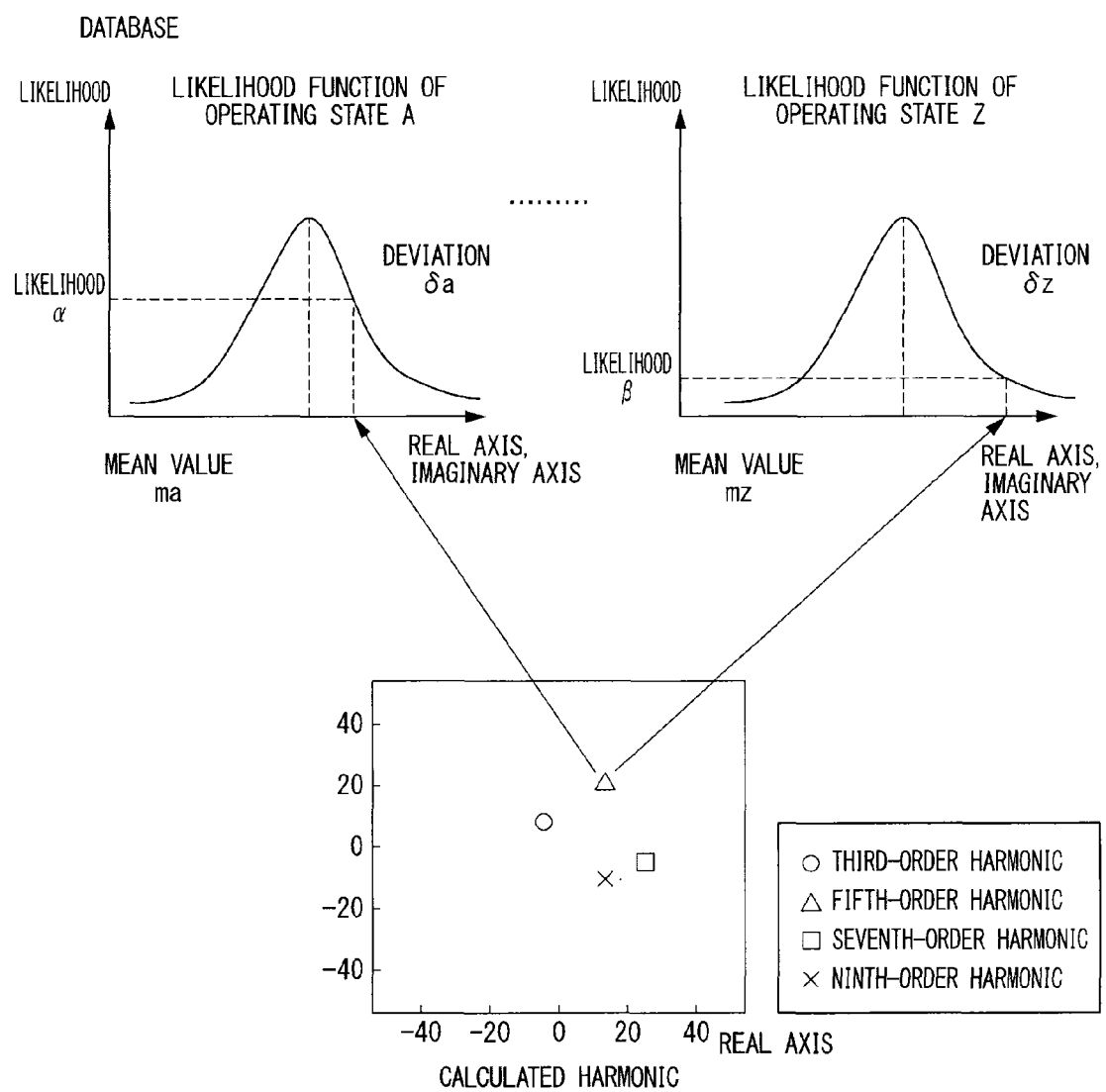
FIG. 19C shows an example of calculating the harmonic likelihood from the characteristics recorded in the device characteristics database 41a in the flowchart of FIG. 18.

FIG. 18 is a flowchart showing the flow of processing to estimate the operating state of a home appliance in the flowchart of FIG. 16 (step ST12). FIG. 19A to FIG. 19C show an example of the processing data in the flowchart of FIG. 18.

The change times and voltage and current time-sequence data of an operating state are input to the FFT operator 23*a* (step ST12-1).

In the FFT operator 23*a*, an FFT is performed on the current or power characteristics waveform to calculate harmonics (step ST12-2). Also, for the current data, the voltage waveform is referenced, and the waveform is extracted at the time at which the voltage phase is zero. By referencing the voltage, the fundamental phase is adjusted and, as a result of this processing, the phase change of the fundamental can also be used as reference information when estimating the operating state.

The device history characteristics detector 32, similar to the device history characteristics detector 32 of the device state estimation apparatus 50, calculates the time-variation characteristics from the time and the voltage and current time-sequence data and compares the calculated characteristics (shown in FIG. 19B) with information in the device history characteristics database 31 (shown in FIG. 19A), and detects a device that is in the ON operating state (step ST12-3).

The likelihood calculator 42*a* considers the ON operating device and, from the characteristics in the device characteristics database 41*a*, calculates the likelihood of the calculated harmonic (FIG. 19C) (step ST12-4).

From among combinations of all device operating states, the likelihood calculator 42*a* generates combination candidates that match ON operating state devices output by the device history characteristics detector 32. For example, in the case of the result being that a washing machine is ON, combinations that include the washing machine being in the ON state, for example, "rinse" for a washing machine or, in the case of a microwave oven, "500 W warming" would be generated as combination candidates. With respect to these combination candidates, a likelihood function is generated from the characteristics of each operating state of each home appliance read out from the device characteristics database 41*a*. As shown in FIG. 19C, it is possible to generate a likelihood function from the distribution information in the device characteristics database 41*a*, for example, from the mean value and deviation of the distribution if the distribution is a normal distribution. Using this likelihood function, the likelihood of the calculated harmonics are calculated and output as sets with the operating states.

The device operating state estimator 43*a* compares the likelihoods calculated by the likelihood calculator 42*a*, selects an operating state having the largest likelihood (step ST12-5), and outputs this as the estimation result. In this manner, the time corresponding to the change time and operating state time-sequence estimation results are output for each home appliance (step ST12-6).

By the constitution of the above-noted embodiment, whereas the device state estimation apparatus 50 estimates the operating state only at the time of a change in the operating state, the device state estimation apparatus 50*a* of the present embodiment can estimate the operating state at all times, thereby improving accuracy. Additionally, because it uses the likelihood to evaluate, the estimation accuracy is improved, because it is possible to perform evaluation using a uniform index from low-order to high-order harmonics.

Figure 20:
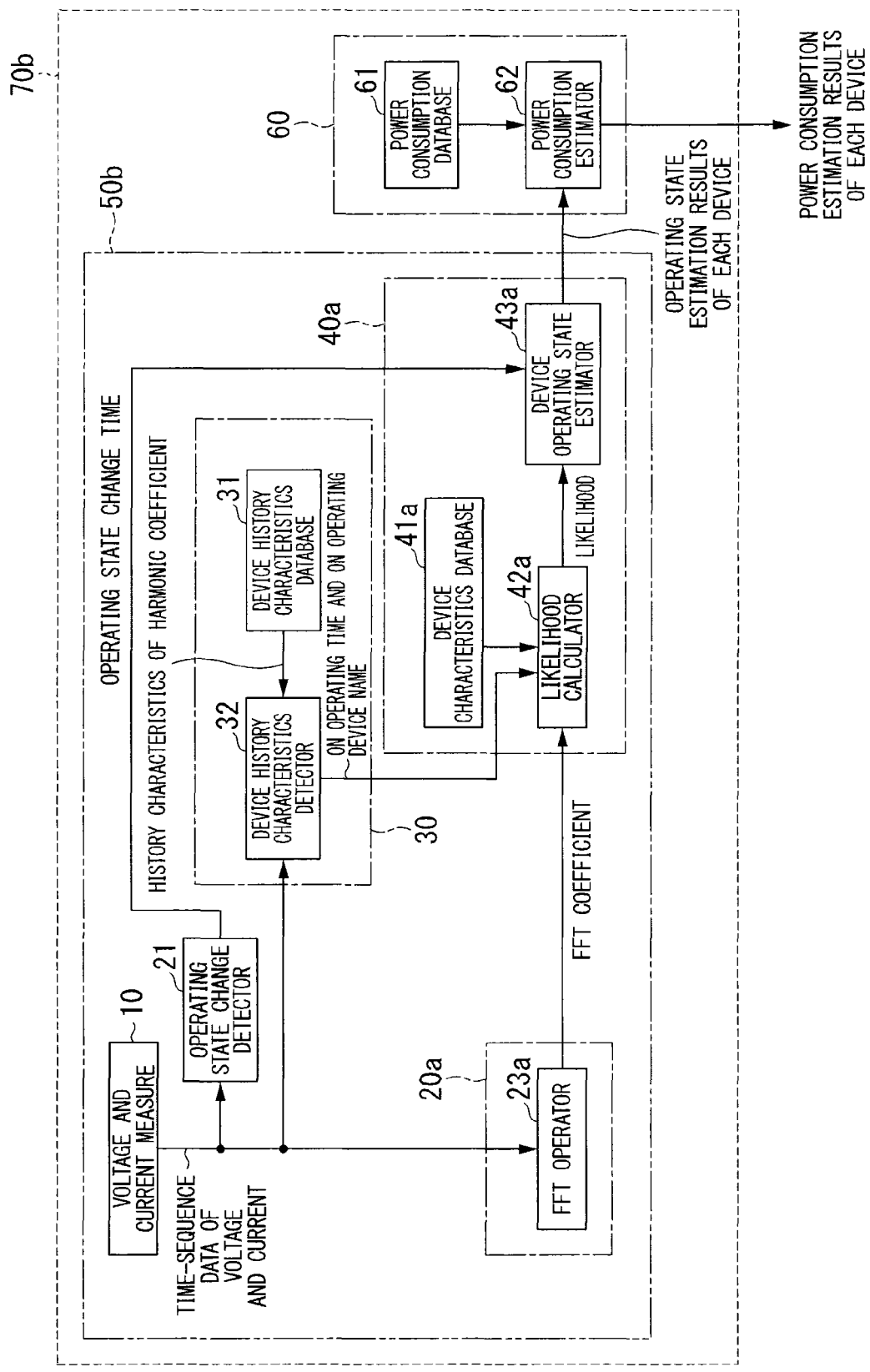
FIG. 20 shows the constitution of a device state estimation apparatus 50b and a device power consumption estimation apparatus 70b of an embodiment.

Continuing, the device state estimation apparatus 50*b* and the device power consumption estimation apparatus 70*b* of the present invention will be described, with references made to the drawings. FIG. 20 shows the constitution of the device state estimation apparatus 50*b* and the device power consumption estimation apparatus 70*b* of the present embodiment. In FIG. 20, parts that are the same as ones in FIG. 14 are assigned the same reference numerals, and the descriptions thereof might be omitted.

As shown in FIG. 20, the device state estimation apparatus 50*b* has a voltage and current measure 10, an operating state change detector 21, a harmonic calculator 20*a* (FFT operator 23*a*), a history characteristics detector 30 (device history characteristics database 31 and device history characteristics detector 32), and an operating state estimator 40*a* (device characteristics database 41*a*, likelihood calculator 42*a*, and device operating state estimator 43*a*). The device power consumption estimation apparatus 70*b* has a device state estimation apparatus 50*b* and a device power consumption estimator 60 (power consumption database 61 and power consumption estimator 62).

The apparatus of the present embodiment has the device state estimation apparatus 50b that estimates the operating state of each home appliance from measurement data of the voltage and current of each home appliance, and the device power consumption estimation apparatus 70b that estimates and outputs the power consumption of each home appliance.

The device state estimation apparatus 50b is the device state estimation apparatus 50a to which is added the operating state change detector 21 in the device state estimation apparatus 50.

The power consumption estimation processing in the device power consumption estimation apparatus 70b of the present embodiment is the same as the power consumption estimation processing in the device power consumption estimation apparatus 70a shown in FIG. 16, and differs with regard to the details of the processing to estimate the operating state of a home appliance (step ST12). This step ST12 will be described in detail.

[Processing to Estimate the Operating State of a Home Appliance]

Figure 21:
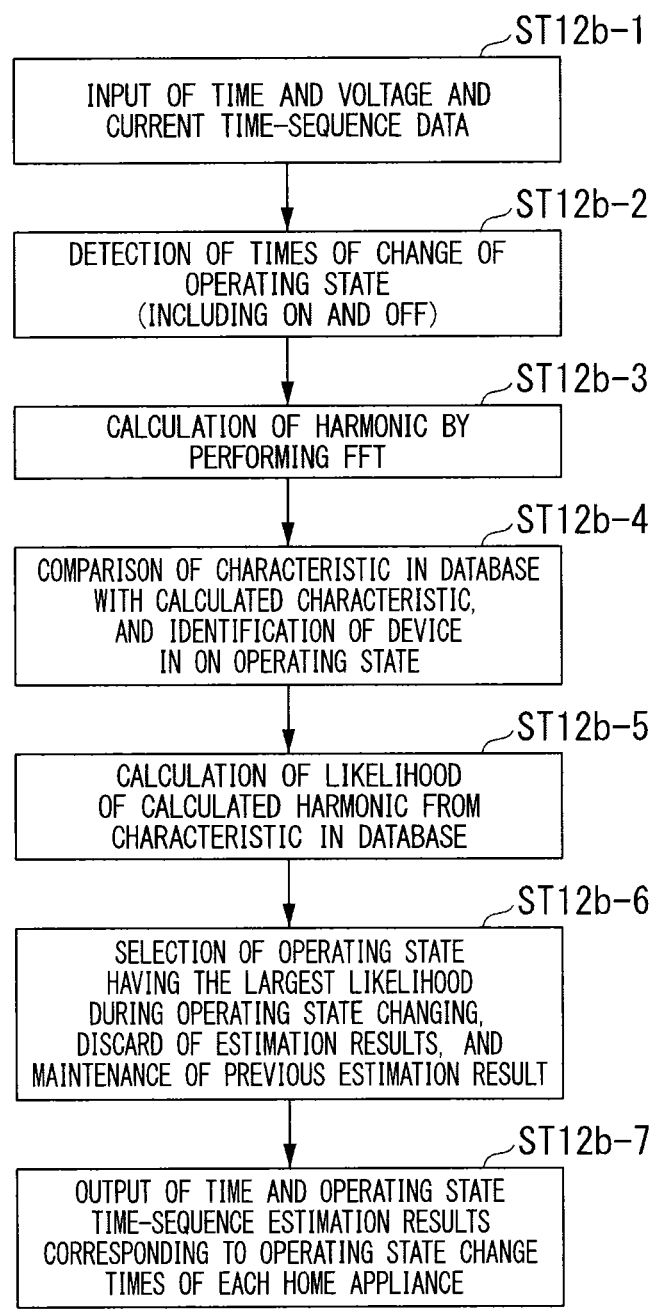
FIG. 21 is a flowchart showing the flow of estimation processing of the operating state of a home appliance in the device power consumption estimation apparatus 70b of the embodiment.

FIG. 21 is a flowchart showing the flow of processing to estimate the operating state of a home appliance in the device power consumption estimation apparatus 70b of the present embodiment.

The voltage and current measure 10 inputs the recorded times and voltage and current time-sequence data to the operating state change detector 21 (step ST12b-1).

The operating state change detector 21 detects the operating state change time (current waveform discontinuity point) from the time and the voltage and current time-sequence data (step ST12b-2) and outputs this operating state change time to the operating state estimator 40a.

The FFT operator 23a calculates harmonics using an FFT (step ST12b-3), the device history characteristics detector 32 compares the characteristics in the device history characteristics database 31 and the calculated characteristics and detects devices in the ON operating state (step ST12b-4), and the likelihood calculator 42a, from the characteristics in the device characteristics database 41a, calculates the likelihood of the calculated harmonics (step ST12b-5). The steps ST12b-3 to ST12b-5 are the same, respectively, as the steps ST12-2 to ST12-4 in the device state estimation apparatus 50a.

The likelihood calculator 42a compares the calculated likelihoods, and selects an operating state having the largest likelihood as the estimation result (step ST12b-6). However, before and after the change time of the operating state (Δt) the likelihood calculator 42a of the device state estimation apparatus 50b discards the estimation results or skips that process, thereby holding the previous (immediately before the change time of the operating state (Δt)) operating state estimation result.

The device operating state estimator 43a corrects the estimation result before and after the time of a change in the operating state (Δt) and outputs the time corresponding to the change time and operating state time-sequence estimation results for each home appliance (step ST12b-7).

By the constitution of the above-noted device state estimation apparatus 50b, estimation before and after an operating state change is either not performed or the estimation results are discarded. Because the state is in transition between before and after a change in operation, the harmonics thereof change greatly. For this reason, the harmonic characteristics during the transition often do not coincide with the characteristics in the device characteristics database 41a, this being a cause of estimation errors. Given this, in the device state estimation apparatus 50b, it is possible to reduce estimation errors by not performing estimation during a transition period.

Figure 22:
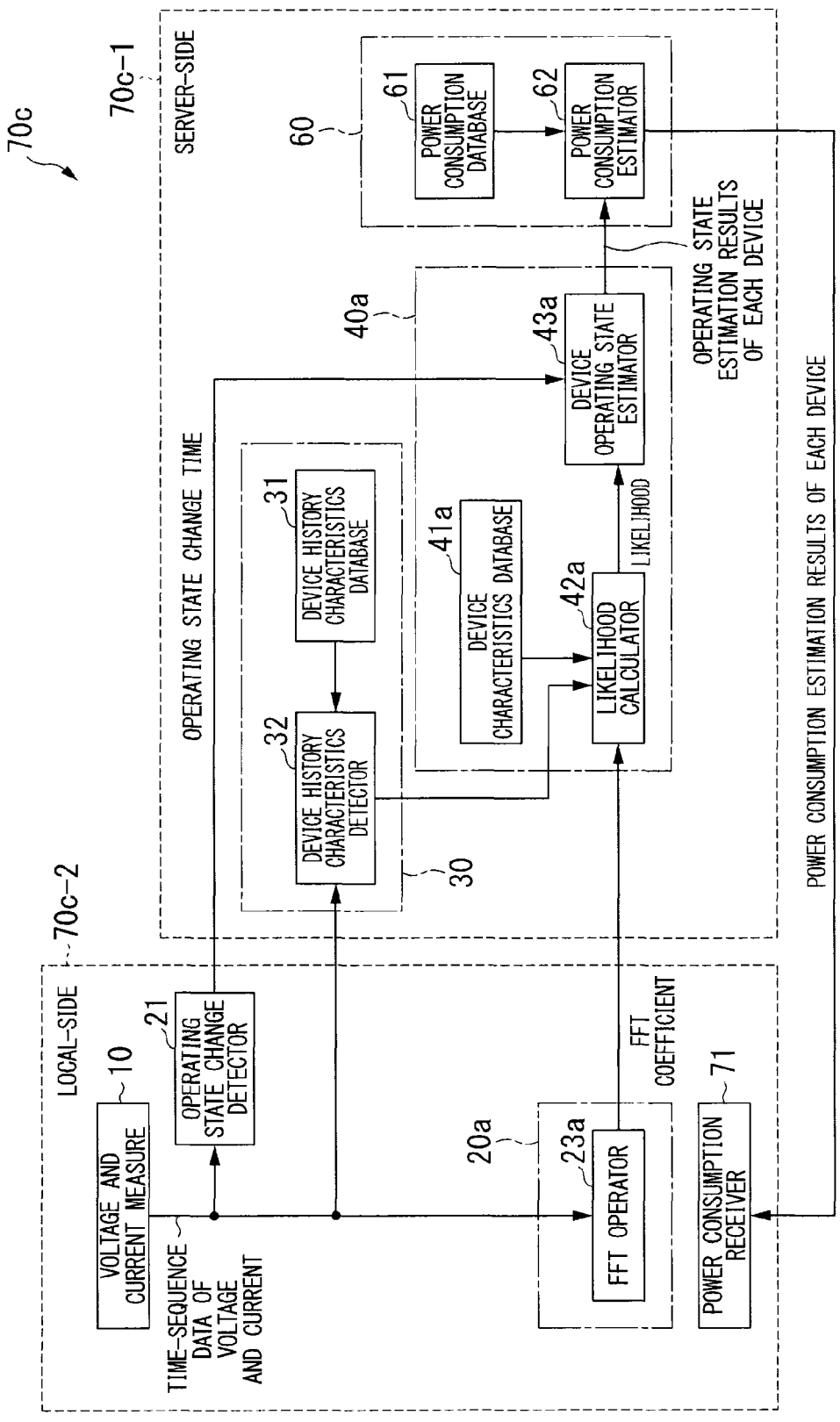
FIG. 22 shows the constitution of a device power consumption estimation apparatus 70c.

Continuing, the device power consumption estimation apparatus 70c of the present embodiment will be described, with references made to the drawings. FIG. 22 shows the constitution of the device power consumption estimation apparatus 70c. In the device power consumption estimation apparatus 70c, the device status detection and device power consumption detection functions of the device power consumption estimation apparatus 70b are divided between a server-side 70_c1 and a local_side 70_c2.

The server-side 70_c1 has a history characteristics detector 30 (device history characteristics database 31 and device history characteristics detector 32), an operating state estimator 40a (device characteristics database 41a, likelihood calculator 42a, and device operating state estimator 43a), and a device power consumption estimator 60 (power consumption database 61 and power consumption estimator 62).

The local-side 70_c2 has a voltage and current measure 10, an operating state change detector 21, a harmonic calculator 20a (FFT operator 23a), and a power consumption receiver 71.

The server-side 70_c1 estimates the power consumption based on the harmonic characteristics obtained from the local-side 70_c2, and transmits the results to the local-side 70_c2. The power consumption receiver 71 on the local-side 70_c2 receives the power consumption estimated by the server-side 70_c1 and displays the received power consumption at the local-side 70_c2.

In this constitution, the results from the FFT operator 23a on the local-side 70_c2 are transmitted to the server-side 70_c1 via a network. On the server-side 70_c1, an operating state having the largest likelihood is estimated from the results from the FFT operator 23a, the power consumption is estimated, and the result is transmitted to the local-side 70_c2. The processing at each of the server-side 70_c1 and local-side 70_C2 is the same as in the device power consumption estimation apparatus 70b. By adopting this constitution, it is possible not only to reduce the hardware cost on the local-side 70_c2, but also to flexibly change the regression model used for estimating the characteristics of the harmonic FFT coefficients and power consumption recorded in the database. For example, it is possible to such things as deterioration with aging on the server-side 70_c1.

The device state estimation apparatus and the device power consumption estimation apparatus of the present embodiment may be implemented by a program and a processor such as a CPU (central processing unit) that executes the program. A program implementing the above-noted functions of the device state estimation apparatus and the device power consumption estimation apparatus may run on a server, a smart meter, a smart tap, and a cloud computer, which are used in an HEMS (Home Energy Management System) that is a power consumption management system for devices in a home or the like, or on another server for the purpose of managing power consumption. The above-noted program may be recorded in a non-temporary computer-readable recording medium, and the program recorded on the medium may be read into a computer system and executed so as to perform control. In this case, "computer system" includes an operating system and hardware such as peripheral devices. The expression "computer-readable recording medium" refers to a removable medium such as a flexible disk, an opto-magnetic disk, a ROM (read only memory), or a CD-ROM, or to a storage device built into a computer, such as a hard-disk. Each of the device state estimation apparatus and device power consumption estimation apparatus may be a computer program product including instructions, which are computer-readable when the computer program product is loaded into a computer processor and executed. In this case, the device state estimation apparatus and device power consumption estimation apparatus may be implemented in software, by downloading and installing a program via an external network such as the Internet.

Although a number of embodiments of the present invention have been described above, these embodiments have been presented as examples and are not intended to restrict the scope of the invention. These embodiments can be subjected to a variety of modifications, and, within the scope of the invention, it is possible to omit, replace, and modify elements in a variety of ways. These embodiments and their variations, in the same manner as being encompassed within the scope and spirit of the present invention, are included in the invention as recited in the claims and in equivalents thereto.

The invention claimed is:

1. A device state estimation apparatus comprising:
a detector configured to calculate a first characteristic from a current or power harmonic in a power feed line, the detector being configured to compare the first characteristic with first characteristic information recorded in a first database to detect devices in an ON operating state;
an operating state estimator configured to read at least one of second characteristics associated with a harmonic from a second database, each of the second characteristics being for operating states of each of the devices, the at least one of the second characteristics being for operating states of the device in the ON operating state which is detected by the detector, the operating state estimator being configured to estimate an operating state of the device in the ON operating state based on a similarity between the at least one of the second characteristics and a calculated one of the second characteristics obtained from the current or power harmonic; and
a harmonic calculator comprising:
an operating state change detector configured to detect a change time of the operating state of the device from time-sequence data of the current;
a characteristic waveform extractor configured to extract a characteristic waveform before and after the change time detected by the operating state change detector from measurement data of voltage or current; and
a first Fourier Transform operator configured to extract a first current waveform from the characteristic waveform extracted by the characteristic waveform extractor, the first Fourier Transform operator being configured to calculate one or more first frequency components, wherein
the detector comprises a second Fourier Transform operator configured to extract a second current waveform from the time-sequence data of the current and to calculate one or more second frequency components, and
wherein the operating state estimator is provided with the one or more first frequency components from the harmonic calculator.

2. The device state estimation apparatus according to claim 1,
wherein the first characteristic includes time-sequence data of the power harmonic.

3. The device state estimation apparatus according to claim 2,
wherein the first characteristic includes statistical information of the time-sequence data of the power harmonic.

4. The device state estimation apparatus according to claim 1,
wherein the first characteristic includes a trace on a complex plane of time-sequence data of the power harmonic.

5. The device state estimation apparatus according to claim 4,
wherein the first characteristic includes at least one of a radius and a center coordinate of an arc formed by the trace on the complex plane of the time-sequence data of the power harmonic and an angular velocity at a time of forming the trace.

6. The device state estimation apparatus according to claim 1, wherein
the second characteristic is Fast Fourier Transform coefficients when obtaining harmonics, and
the operating state estimator is configured to judge the similarity based on a weighting distance between the Fast Fourier Transform coefficients.

7. The device state estimation apparatus according to claim 1,
wherein the operating state estimator is configured to calculate a likelihood from the at least one of the second characteristics and the calculated one of the second characteristics obtained from the power harmonic to judge the similarity based on the calculated likelihood.

8. The device state estimation apparatus according to claim 7,
wherein the at least one of the second characteristics is statistical information associated with a harmonic distribution of each operating state of the device.

9. The device state estimation apparatus according to claim 8,
wherein the at least one second characteristics is a mean value and deviation when the harmonic distribution of each operating state of the device is taken as a normal distribution.

10. The device state estimation apparatus according to claim 7, wherein
the first characteristic includes at least one of a radius and a center coordinate of an arc formed by a trace on a complex plane of time-sequence data of the power harmonic and an angular velocity at a time of forming the trace,
the operating state change detector is configured to detect a point of discontinuity in a current waveform from the time-sequence data of the current and to take this point as the change time of the operating state, and
the operating state estimator is configured to reference the change time of the operating state to correct estimation results over a time period of $\Delta t$ before and after the change time of the operating state.

11. The device state estimation apparatus according to claim 10,
wherein the operating state estimator is configured to reference the change time of the operating state, to discard the estimation results over the time period of $\Delta t$ before and after the change time of the operating state, and to hold an estimation result of the operating state immediately before the time period of Δt.

12. A device power consumption estimation apparatus comprising:
a device state estimation apparatus comprising:
   a detector configured to calculate a first characteristic from a current or power harmonic in a power feed line, the detector being configured to compare the first characteristic with first characteristic information recorded in a first database to detect devices in an ON operating state;
   an operating state estimator configured to read at least one of second characteristics from a second database, each of the second characteristics being for operating states of each of the devices, the at least one of the second characteristics being for operating states of the device in the ON operating state which is detected by the detector, the operating state estimator being configured to estimate an operating state of the device in the ON operating state based on a similarity between the at least one of the second characteristics and a calculated one of the second characteristics obtained from the current or power harmonic; and
   a device power consumption estimator configured to estimate power consumption of the device based on the operating state estimated by the operating state estimator, the device power consumption estimator comprising:
      a power consumption database storing beforehand harmonic characteristics of each operating state of the device and a corresponding power consumption; and
      a power consumption estimator configured to estimate power consumption from the harmonic characteristics of each operating state and information of the power consumption database.

13. A device power consumption estimation apparatus according to claim 11, comprising:
   a device power consumption estimator configured to estimate power consumption of the device based on the operating state estimated by the operating state estimator, wherein
   the device power consumption estimator includes:
      a power consumption database storing beforehand harmonic characteristics of each operating state of the device and a corresponding power consumption; and
      a power consumption estimator that estimates power consumption from the harmonic characteristics of each operating state and information of the power consumption database,
   functions of detecting device state and detecting device power consumption are divided between a server-side and local-side,
   the local-side includes the operating state change detector, the first Fourier Transform operator, and a power consumption receiver,
   the first Fourier Transform operator extracts the first current waveform and calculates the one and more first frequency components,
   the power consumption receiver receives the power consumption estimated on the server-side and displays the received power consumption, and
   the server-side, which includes the detector, the operating state estimator, and the device power consumption estimator, estimates the power consumption based on the harmonic characteristics obtained from the local-side and transmits results to the local-side.

14. The device state estimation apparatus according to claim 1, wherein
   the first Fourier Transform operator is configured to perform a Fast Fourier Transform on the characteristic waveform extracted by the characteristic waveform extractor, and
   the second Fourier Transform operator is configured to perform a Fast Fourier Transform on the time-sequence data of the current.

15. A device state estimation method comprising:
detecting a change time of an operating state of at least one device from a time-sequence data of current in a power feed line;
extracting a characteristic waveform before and after the change time from measurement data of voltage or current in the power feed line;
performing a first Fourier Transform on the characteristic waveform to calculate one or more first frequency components;
performing a second Fourier Transform on the time-sequence data of the current to calculate one or more second frequency components;
comparing the one or more second frequency components with characteristic information recorded in a first database to detect devices in an ON operating state;
reading at least one of characteristics associated with a harmonic from a second database, each of the characteristics associated with the harmonic being for operating states of each of the devices, the at least one of the characteristics associated with the harmonic being for operating states of the device in the ON operating state; and
estimating the operating state of the device in the ON operating state based on the one or more first frequency components and a similarity between the at least one of the characteristics associated with the harmonic and a calculated one of the characteristics associated with the harmonic obtained from a current or power harmonic in the power feed line.

16. A device power consumption estimation method comprising:
calculating a first characteristic from a current or power harmonic in a power feed line;
comparing the first characteristic with first characteristic information recorded in a first database to detect devices in an ON operating state;
reading at least one of second characteristics from a second database, each of the second characteristics being for operating states of each of the devices, the at least one of the second characteristics being for operating states of the device in the ON operating state;
estimating an operating state of the device in the ON operating state based on a similarity between the at least one of the second characteristics and a calculated one of the second characteristics obtained from the current or power harmonic; and
estimating power consumption of the device based on characteristics of each operating state and information of a third database storing beforehand harmonic characteristics of each operating state of the device and a corresponding power consumption.

* * * * *